(12) United States Patent
Yagihashi et al.

(10) Patent No.: US 11,162,189 B2
(45) Date of Patent: Nov. 2, 2021

(54) SEMICONDUCTOR SUBSTRATE, GALLIUM NITRIDE SINGLE CRYSTAL, AND METHOD FOR PRODUCING GALLIUM NITRIDE SINGLE CRYSTAL

(71) Applicant: DEXERIALS CORPORATION, Tokyo (JP)

(72) Inventors: Kazuhiro Yagihashi, Tokyo (JP); Shinya Akiyama, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/289,864

(22) Filed: Mar. 1, 2019

(65) Prior Publication Data
US 2019/0271097 A1  Sep. 5, 2019

(30) Foreign Application Priority Data

Mar. 2, 2018 (JP) .............................. JP2018-037524
Sep. 27, 2018 (JP) .............................. JP2018-182583

(51) Int. Cl.
| | | |
|---|---|---|
| *C30B 29/38* | (2006.01) | |
| *C30B 29/40* | (2006.01) | |
| *C30B 19/12* | (2006.01) | |
| *H01L 29/20* | (2006.01) | |
| *H01L 21/02* | (2006.01) | |
| *C30B 19/04* | (2006.01) | |
| *H01S 5/30* | (2006.01) | |
| *H01L 33/32* | (2010.01) | |

(52) U.S. Cl.
CPC ............ *C30B 29/406* (2013.01); *C30B 19/04* (2013.01); *C30B 19/12* (2013.01); *C30B 29/38* (2013.01); *H01L 21/0254* (2013.01); *H01L 21/02625* (2013.01); *H01L 29/2003* (2013.01); *H01L 33/32* (2013.01); *H01S 5/3013* (2013.01)

(58) Field of Classification Search
CPC ....... C30B 19/04; C30B 29/38; C30B 29/406; H01L 21/0242; H01L 21/02458; H01L 21/0254; H01L 21/02625
See application file for complete search history.

(56) References Cited

U.S. PATENT DOCUMENTS

| 2002/0190275 A1* | 12/2002 | Shibata ............... H01L 21/0237 257/200 |
| 2005/0230688 A1* | 10/2005 | Lee ................... H01L 21/02378 257/79 |
| 2005/0230696 A1* | 10/2005 | Shakuda .................. H01S 5/32 257/94 |

(Continued)

FOREIGN PATENT DOCUMENTS

| JP | H08-310900 A | 11/1996 |
| JP | 2000-269605 A | 9/2000 |
| JP | 2015-071529 A | 4/2015 |

*Primary Examiner* — Matthew J Song
(74) *Attorney, Agent, or Firm* — Paratus Law Group, PLLC

(57) ABSTRACT

There is provided a semiconductor substrate including: a sapphire substrate; an intermediate layer formed of gallium nitride with random crystal directions and provided on the sapphire substrate; and at least one or more semiconductor layers each of which is formed of a gallium nitride single crystal and that are provided on the intermediate layer.

15 Claims, 12 Drawing Sheets

(56) References Cited

U.S. PATENT DOCUMENTS

| | | | |
|---|---|---|---|
| 2010/0059717 A1* | 3/2010 | Mori | C30B 19/02 |
| | | | 252/506 |
| 2010/0244086 A1* | 9/2010 | Hanawa | H01L 21/02573 |
| | | | 257/103 |
| 2013/0069208 A1* | 3/2013 | Briere | H01L 29/157 |
| | | | 257/655 |
| 2013/0199438 A1* | 8/2013 | Nagai | C30B 9/06 |
| | | | 117/58 |
| 2014/0332822 A1* | 11/2014 | Takeya | H01L 29/66431 |
| | | | 257/76 |
| 2015/0001582 A1* | 1/2015 | Laboutin | H01L 29/66462 |
| | | | 257/190 |
| 2016/0201215 A1* | 7/2016 | Watanabe | C30B 29/406 |
| | | | 117/67 |
| 2018/0351038 A1* | 12/2018 | Watanabe | C30B 29/406 |

\* cited by examiner

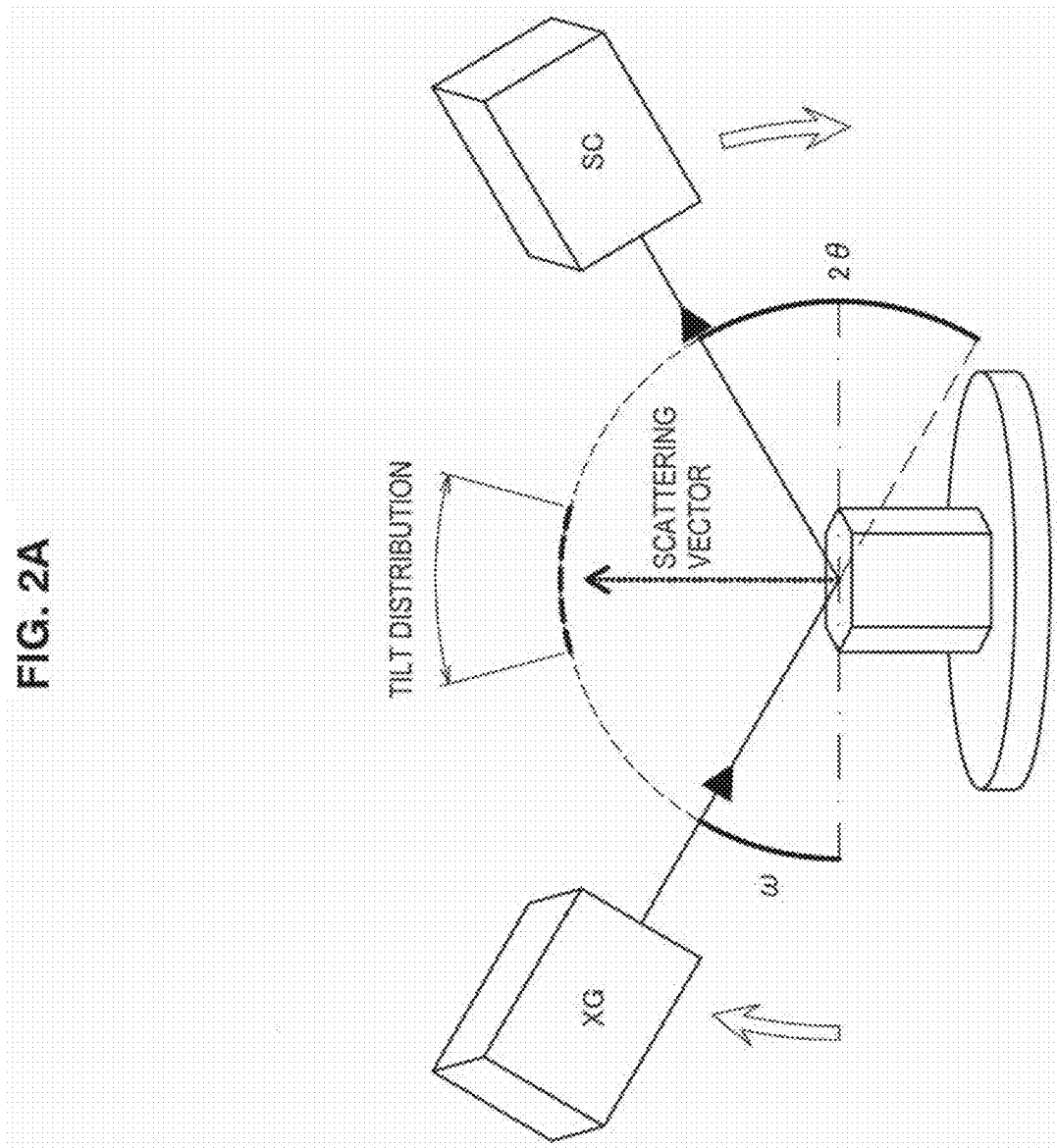

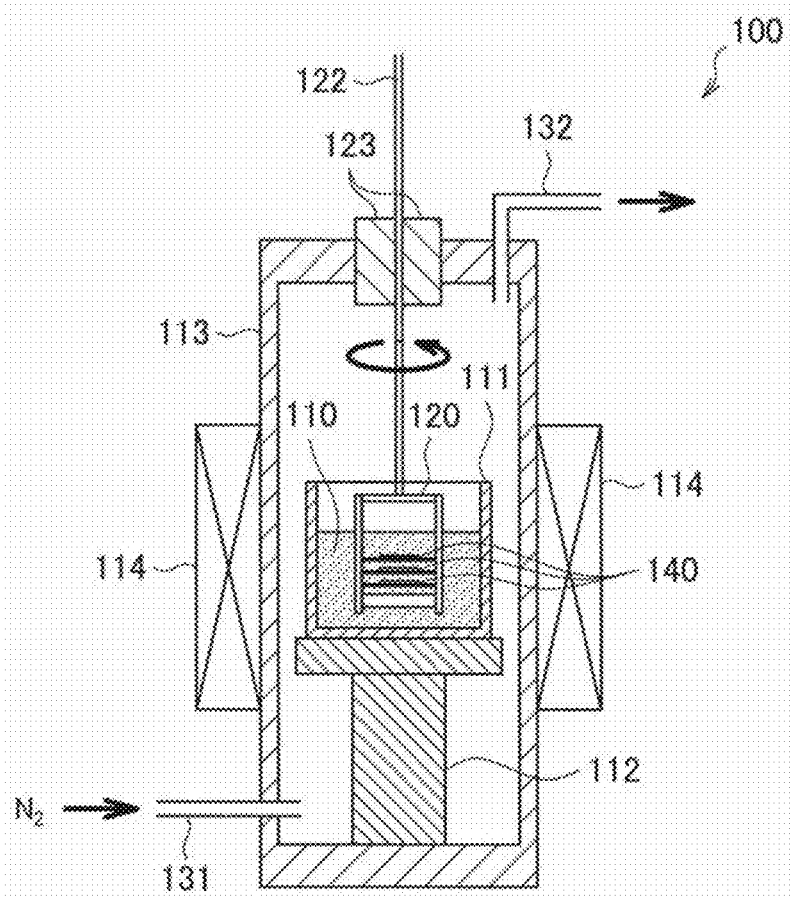

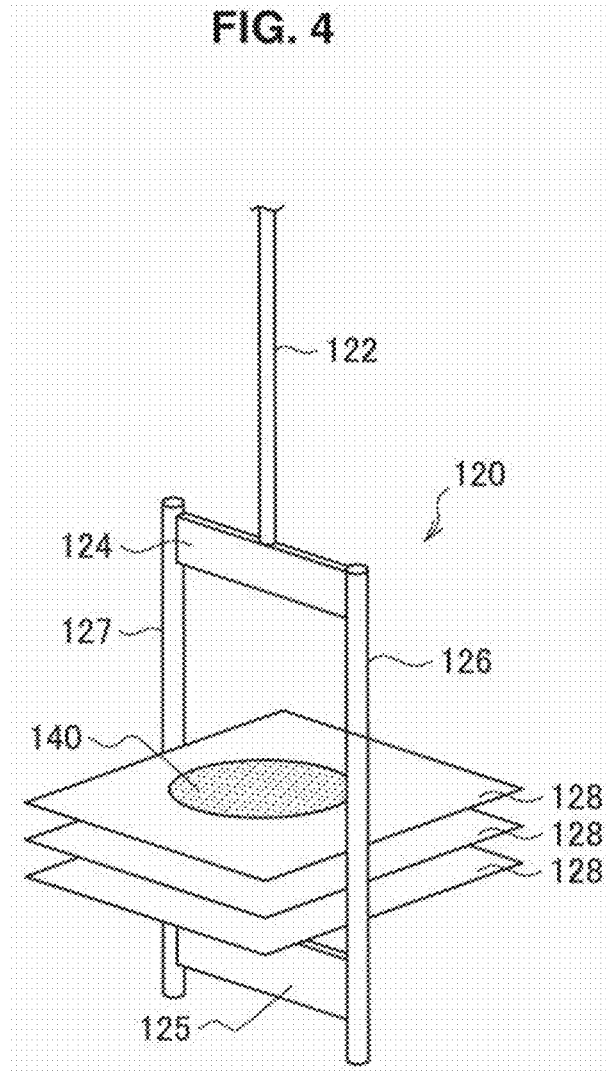

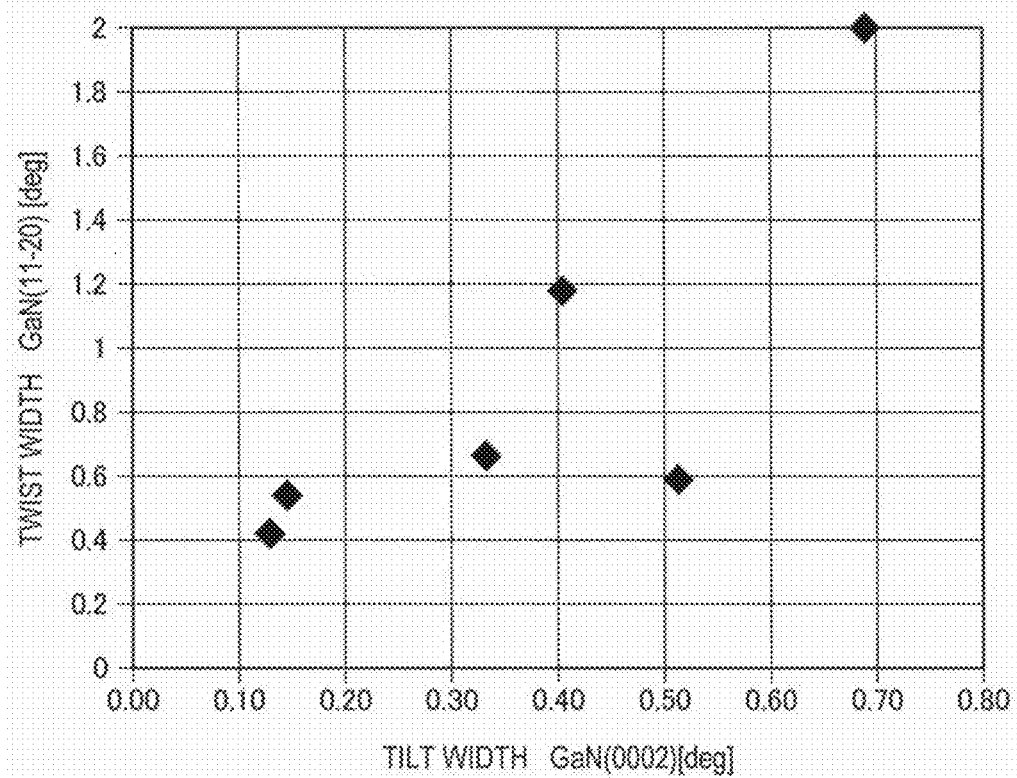

SEMICONDUCTOR SUBSTRATE, GALLIUM NITRIDE SINGLE CRYSTAL, AND METHOD FOR PRODUCING GALLIUM NITRIDE SINGLE CRYSTAL

CROSS REFERENCE TO RELATED APPLICATION(S)

This application is based upon and claims benefit of priority from Japanese Patent Application No. 2018-037524, filed on Mar. 2, 2018, and Japanese Patent Application No. 2018-182583, filed on Sep. 27, 2018, the entire contents of which are incorporated herein by reference.

BACKGROUND

The present invention relates to a semiconductor substrate, a gallium nitride single crystal, and a method for producing a gallium nitride single crystal.

These days, gallium nitride (GaN) is drawing attention as a semiconductor material for forming a blue light emitting diode, a semiconductor laser, a high-voltage, high-frequency power source integrated circuit (IC), or the like.

In the case where gallium nitride is formed as a single crystal thin film on a sapphire substrate or the like, a vapor phase growth method such as the hydride vapor phase epitaxy method or the metal organic chemical vapor deposition method is generally used. The hydride vapor phase epitaxy method is performed by reacting ammonia gas and gallium chloride vapor on a substrate, for example.

In such a vapor phase growth method, a gallium nitride crystal is grown on a substrate formed of a different kind of material such as sapphire. Thus, for such a vapor phase growth method, a technology in which a buffer layer is provided in order to ease a difference in thermal expansion coefficient or lattice mismatching between a substrate and gallium nitride is known, as disclosed in JP H8-310900A and JP 2000-269605A.

However, even in the case where the technology disclosed in JP H8-310900A or JP 2000-269605A is employed, a large number of crystal defects exist in a gallium nitride crystal synthesized by vapor phase growth, and consequently it has been difficult to obtain target characteristics when the gallium nitride crystal is incorporated in a device. Furthermore, in the vapor phase growth method, ammonia gas having high reactivity is used as a nitrogen source; hence, a facility for removing harmful gases is needed, and the production process and the production apparatus are complicated; consequently, the production cost of a gallium nitride crystal is increased.

Here, as disclosed in JP 2015-71529A, a method in which a gallium nitride crystal is produced using liquid phase growth is studied as a method for producing a gallium nitride crystal in which crystal defects are less likely to occur. In the liquid phase growth method, a gallium nitride crystal can be grown in a layer form in a staircase configuration by crystal precipitation from a liquid phase; thus, it is said that lattice mismatching is less likely to occur and the occurrence of crystal defects in the gallium nitride crystal can be suppressed.

SUMMARY

However, even in the case where the technology disclosed in JP 2015-71529A is employed, it has remained difficult to form a gallium nitride crystal in which the amount of crystal defects is sufficiently reduced.

Thus, the present invention has been made in view of the problem mentioned above, and an object of the present invention is to provide a semiconductor substrate including a gallium nitride crystal in which the amount of crystal defects is reduced more, the gallium nitride single crystal, and a method for producing the gallium nitride single crystal.

According to an aspect of the present invention, there is provided a semiconductor substrate including: a sapphire substrate; an intermediate layer formed of gallium nitride with random crystal directions and provided on the sapphire substrate; and at least one or more semiconductor layers each of which is formed of a gallium nitride single crystal and that are provided on the intermediate layer.

A tilt width of gallium nitride that forms the intermediate layer and the semiconductor layer may be more than or equal to 0.05° and less than or equal to 0.4°.

A twist width of gallium nitride that forms the intermediate layer and the semiconductor layer may be more than or equal to 0.1° and less than or equal to 0.7°.

A plane orientation of a surface of the sapphire substrate on which the intermediate layer is provided may be a c-plane or an a-plane.

Gallium nitride that forms the intermediate layer and the semiconductor layer may contain iron atoms, and a concentration distribution of iron atoms in a thickness direction of the gallium nitride may be included in a range of more than or equal to $1.0 \times 10^{16}$ atoms/cm$^3$ and less than or equal to $1.0 \times 10^{22}$ atoms/cm$^3$.

The concentration distribution of iron atoms in the thickness direction of the gallium nitride may have a distribution of a shape that is higher in a surface region of the gallium nitride and an interface region with the sapphire substrate and is lower in an intermediate region between the surface region and the interface region.

A highest value of a concentration of iron atoms in the interface region may be more than or equal to 10 times a lowest value of a concentration of iron atoms in the intermediate region.

A highest value of a concentration of iron atoms in the surface region may be more than or equal to 10 times a lowest value of a concentration of iron atoms in the intermediate region.

In the thickness direction of the gallium nitride, a difference between concentrations of iron atoms at arbitrary two points in the intermediate region may be less than or equal to 50% of the concentration of iron atoms at either one of the arbitrary two points.

In an in-plane direction of the gallium nitride, a difference between concentrations of iron atoms at arbitrary two points in the intermediate region may be less than or equal to 50% of the concentration of iron atoms at either one of the arbitrary two points.

The interface region may be a region within 2 μm in the thickness direction of the gallium nitride from an interface with the sapphire substrate, and the surface region may be a region within 1 μm in the thickness direction of the gallium nitride from a surface of the gallium nitride.

According to another aspect of the present invention, there is provided at least one or more layers of gallium nitride single crystals that are provided on a sapphire substrate via an intermediate layer formed of gallium nitride with random crystal directions and each of which is formed of a single crystal.

Each of tilt widths of the gallium nitride that forms the intermediate layer and the gallium nitride single crystal may be more than or equal to 0.05° and less than or equal to 0.4°.

Each of twist widths of the gallium nitride that forms the intermediate layer and the gallium nitride single crystal may be more than or equal to 0.1° and less than or equal to 0.7°.

A plane orientation of a side of the sapphire substrate on which the intermediate layer is provided may be a c-plane or an a-plane.

According to another aspect of the present invention, there is provided a method for producing a gallium nitride single crystal included in the above semiconductor substrate or the above gallium nitride single crystal, the method including: a step of heating metal gallium and iron nitride in a nitrogen atmosphere to at least a reaction temperature at which the iron nitride and the metal gallium react together; and a step of, after the metal gallium and the iron nitride are heated to the reaction temperature, holding the metal gallium and the iron nitride at a temperature within a range of the reaction temperature for more than or equal to 20 hours. The sapphire substrate is provided in the heated metal gallium and the heated iron nitride, the iron nitride contains one or more of tetrairon mononitride, triiron mononitride, and diiron mononitride, and the reaction temperature is more than 700° C. and less than or equal to 1000° C.

By the configuration mentioned above, the occurrence of crystal defects due to lattice mismatching between a sapphire substrate, which is a different kind of material, and a semiconductor layer can be suppressed by the intermediate layer.

As described above, according to the present invention, a gallium nitride crystal in which the amount of crystal defects is reduced more can be provided.

BRIEF DESCRIPTION OF THE DRAWINGS

FIG. 2A is an explanatory diagram schematically describing tilt measurement in X-ray diffraction;

FIG. 3 is a schematic diagram describing a configuration of a reaction apparatus used for production of a gallium nitride single crystal according to an embodiment of the present invention;

FIG. 4 is a perspective view showing a holder for a substrate shown in FIG. 3 more specifically;

FIG. 7 is a scatter diagram showing a correlation between tilt width and twist width;

DETAILED DESCRIPTION OF THE EMBODIMENT(S)

Figure 1:
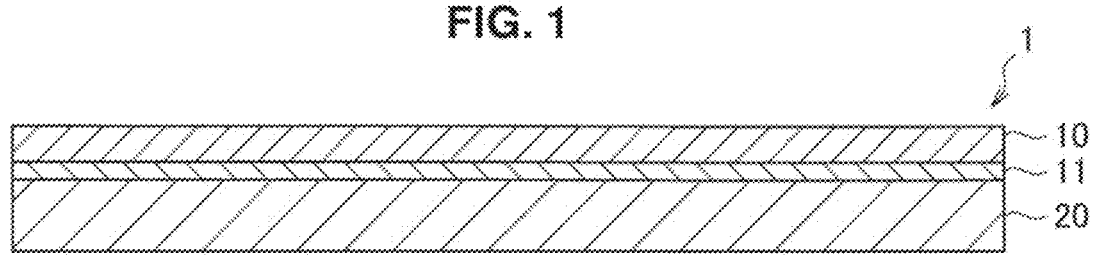
FIG. 1 is a schematic diagram describing a cross-sectional configuration of a semiconductor substrate according to an embodiment of the present invention taken along a thickness direction.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

In the drawings referred to in the following description, the sizes of some constituent members may be expressed exaggeratedly for convenience of description. Therefore, the relative sizes of constituent members shown in the drawings do not necessarily express the actual magnitude relationships between constituent members accurately. Further, in the following description, the stacking direction is expressed as the up and down direction, and the side on which a sapphire substrate exists is expressed as the lower side.

<1. Semiconductor Substrate>

First, the configuration of a semiconductor substrate according to an embodiment of the present invention is described with reference to FIG. 1. FIG. 1 is a schematic diagram describing a cross-sectional configuration of a semiconductor substrate according to the present embodiment taken along the thickness direction.

As shown in FIG. 1, a semiconductor substrate 1 includes a sapphire substrate 20, an intermediate layer 11, and a semiconductor layer 10. Of them, the intermediate layer 11 and the semiconductor layer 10 are formed of gallium nitride.

The sapphire substrate 20 is a plate-like support body formed of single crystal sapphire, for example. Single crystal sapphire is a crystalline substance of the corundum structure made of α-alumina (α-$Al_2O_3$), and has excellent mechanical characteristics and thermal characteristics, chemical stability, and light transmissivity. Hence, the sapphire substrate 20 can be suitably used for a substrate for producing a blue light emitting diode, a semiconductor laser, or the like, for example. The thickness of the sapphire substrate 20 may be approximately 0.4 mm, for example.

In the sapphire substrate 20, it is preferable that the plane orientation of the surface on which the intermediate layer 11 is provided be the c-plane or the a-plane. In the semiconductor substrate 1 according to the present embodiment, a gallium nitride crystal can be grown more epitaxially by stacking the intermediate layer 11 and the semiconductor layer 10 on the c-plane or the a-plane of the sapphire substrate 20.

The intermediate layer 11 is provided on the sapphire substrate 20, and is formed of gallium nitride having random crystal orientations. The intermediate layer 11 adjusts the lattice constants of the sapphire substrate 20 and the semiconductor layer 10, and thereby assists a gallium nitride single crystal that forms the semiconductor layer 10 in growing so as to be in an epitaxial manner and cause fewer crystal defects. The thickness of the intermediate layer 11 may be less than or equal to 100 nm, for example.

The semiconductor layer 10 is provided on the intermediate layer 11, and is formed of a gallium nitride single crystal. In other words, the semiconductor layer 10 is provided as a single crystal film made of gallium nitride on the intermediate layer 11. The gallium nitride single crystal that forms the semiconductor layer 10 is provided by epitaxially growing on the sapphire substrate 20, for example. The thickness of the semiconductor layer 10 may be approximately several micrometers, for example.

A plurality of semiconductor layers 10 may be provided on the intermediate layer 11. That is, two or more semiconductor layers 10 may be stacked on the intermediate layer 11. The upper limit of the number of semiconductor layers 10 stacked is not particularly provided; but if the number of semiconductor layers 10 stacked is excessive, the semiconductor substrate 1 may warp in the stacking direction of the semiconductor layers 10. Thus, the upper limit of the number of semiconductor layers 10 stacked may be 10, for example.

<2. Characteristics of Gallium Nitride Crystal>

In the following, a first characteristic and a second characteristic possessed by the intermediate layer 11 and the semiconductor layer 10 (that is, gallium nitride crystals) provided in the semiconductor substrate 1 according to the present embodiment are described.

(First Characteristic)

First, the first characteristic possessed by a gallium nitride crystal is described in more detail with reference to FIG. 2A and FIG. 2B.

According to the present embodiment, a semiconductor layer 10 formed of a gallium nitride single crystal in which the amount of crystal defects is reduced more can be formed on the sapphire substrate 20. For the analysis of the crystallinity of such a single crystal film, thin-film X-ray diffraction may be used, for example. The measurement of thin-film X-ray diffraction may be performed by a fully automatic horizontal multipurpose X-ray analysis apparatus, "SmartLab 3XG," manufactured by Rigaku Corporation, for example.

Specifically, an index indicating the crystallinity in the stacking direction of a crystal (that is, the level of uniformity of crystal orientation in the stacking direction of a crystal) is generally referred to as tilt, and can be measured by X-ray diffraction like that shown in FIG. 2A. FIG. 2A is an explanatory diagram schematically describing tilt measurement in X-ray diffraction.

As shown in FIG. 2A, in tilt measurement of X-ray diffraction, measurement is performed using an out-of-plane arrangement in which the detection of incidence and diffraction of X-rays is performed in a plane perpendicular to the surface of the sample. Such measurement is referred to also as symmetrical reflection measurement because the angle of incidence and the angle of emission of X-rays with respect to the surface of the sample are equal. In tilt measurement of X-ray diffraction, lattice planes parallel to the surface of the sample are measured. Specifically, the diffraction intensity is measured by, as shown in FIG. 2A, using an optical system of a parallel beam method and using a technique in which a detector is fixed to the angle of diffraction (2θ) and the sample is oscillated about an w-axis. In tilt measurement of X-ray diffraction, the orientation distribution of orientation axes in the stacking direction of a crystal that is the sample can be assessed from the variation in diffraction intensity at this time.

The entry depth of X-rays to the sample in tilt measurement is approximately several tens of micrometers. Therefore, it is surmised that the value of peak intensity in tilt measurement of X-ray diffraction is dependent on the volume (the average thickness) of the intermediate layer 11 and the semiconductor layer 10 (that is, gallium nitride crystals) existing in the X-ray irradiation region, for example.

Figure 2B:
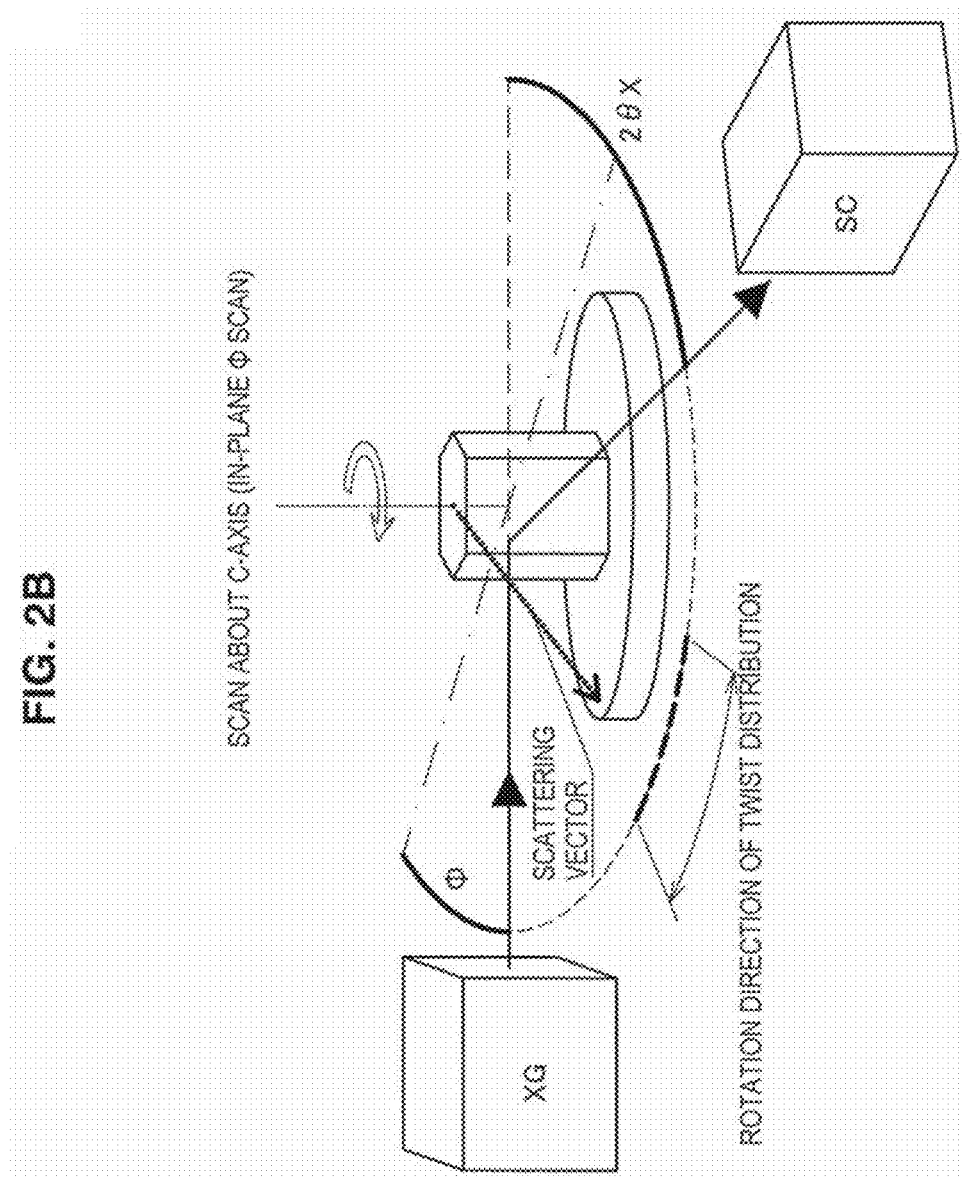
FIG. 2B is an explanatory diagram schematically describing twist measurement in X-ray diffraction.

An index indicating the crystallinity in the in-plane direction of a crystal (that is, the level of uniformity of crystal orientation in the in-plane direction of a crystal) is generally referred to as twist, and can be measured by X-ray diffraction like that shown in FIG. 2B. FIG. 2B is an explanatory diagram schematically describing twist measurement in X-ray diffraction.

As shown in FIG. 2B, in twist measurement of X-ray diffraction, measurement is performed using an optical system of a parallel beam method and using an in-plane arrangement in which the detection of incidence and diffraction of X-rays is performed in the plane of the surface of the sample. In twist measurement of X-ray diffraction, X-rays are caused to be incident closely to the surface of the sample, and diffraction from lattice planes orthogonal to the surface of the sample is measured. Specifically, the diffraction intensity is measured by, as shown in FIG. 2B, a technique in which a detector is fixed to the value of $2\theta_\chi$ calculated from the distance between lattice planes of the sample that is the measurement object by using Bragg's equation and the sample is oscillated about a φ-axis. In twist measurement of X-ray diffraction, the orientation distribution of orientation axes in the in-plane direction of a crystal that is the sample can be assessed from the variation in diffraction intensity at this time.

In twist measurement, values of peak intensity can be relatively compared by setting the X-ray irradiation region in agreement while standardizing conditions of a measuring optical system, such as the angle of incidence, the width of an incidence slit, and the width of a length limiting slit. In such a case, it is surmised that the value of peak intensity is dependent on the volume (the average thickness) of the intermediate layer 11 and the semiconductor layer 10 (that is, gallium nitride crystals) existing in the X-ray irradiation region, for example.

The intermediate layer 11 and the semiconductor layer 10 formed of gallium nitride are formed on the sapphire substrate 20 formed of a different kind of material by heteroepitaxial growth. However, gallium nitride is quite different in crystal structure from sapphire, and there is approximately 16% lattice mismatching (also referred to as mismatches); hence, the crystal structure is likely to be disordered near the interface. Thus, it is important to assess the crystallinity or the level of crystal defects of the intermediate layer 11 and the semiconductor layer 10 provided on the sapphire substrate 20.

In addition, in a gallium nitride single crystal, growth anisotropy is greatly different between the stacking direction and the in-plane direction. Therefore, in the assessment of the crystallinity of the semiconductor layer 10 formed of a gallium nitride single crystal, it is important to perform precise analysis while separating the stacking direction and the in-plane direction of the crystal.

The full width at half maximum of a peak of tilt (also referred to as tilt width) of gallium nitride crystals that form the intermediate layer 11 and the semiconductor layer 10, which width is measured by the X-ray diffraction described above, may be more than or equal to 0.05° and less than or equal to 0.4°. Further, the full width at half maximum of a peak of twist (also referred to as twist width) of gallium nitride crystals that form the intermediate layer 11 and the semiconductor layer 10 may be more than or equal to 0.1° and less than or equal to 0.7°. The semiconductor layer 10 included in the semiconductor substrate 1 according to the present embodiment have high crystallinity, and can therefore reduce the tilt width and the twist width described above.

Furthermore, according to the present embodiment, a semiconductor layer 10 formed of a gallium nitride single crystal and having a better in-plane distribution of crystallinity can be formed on the sapphire substrate 20. The in-plane distribution of crystallinity of the semiconductor layer 10 can be measured in the following manner, using X-ray diffraction.

Specifically, as shown in FIG. 2A, the in-plane distribution of crystallinity of the semiconductor layer 10 is measured using an out-of-plane arrangement in which the detection of incidence and diffraction of X-rays is performed in a plane perpendicular to the surface of the sample. Such measurement is referred to also as symmetrical reflection measurement because the angle of incidence and the angle of emission of X-rays with respect to the surface of the sample are equal. However, in the measurement of the in-plane distribution of the semiconductor layer 10, unlike the tilt measurement mentioned above, measurement is performed by using a light collecting optical system for micro-crystalline diffraction and linking the angle of diffraction (2θ) and the sample axis (θ) together. The in-plane variation in the crystallinity of the semiconductor layer 10 can be assessed by performing such measurement on a plurality of points of the sapphire substrate 20 and calculating the average value and the standard deviation, and calculating the value of standard deviation/average value of the peak intensities of the (0 0 0 2) plane of gallium nitride at the measurement points.

As shown in Examples described later, in the semiconductor layer 10 included in the semiconductor substrate 1 according to the present embodiment, the index mentioned above is low, and therefore it can be understood that the in-plane distribution of crystallinity is good.

Furthermore, according to the present embodiment, a semiconductor layer 10 formed of a gallium nitride single crystal and having few threading dislocations can be formed on the sapphire substrate 20. The density of threading dislocations of the semiconductor layer 10 can be measured in the following manner, using an etch-pit method.

Specifically, the semiconductor substrate 1 is immersed in a heated basic solution or the like and is then cleaned with a diluted acidic solution, and the surface of the semiconductor layer 10 is observed with an atomic force microscope (AFM). A threading dislocation of the semiconductor layer 10 forms a hole portion eroded by hot alkali; thus, the density of threading dislocations per unit area of the semiconductor layer 10 can be calculated by measuring the number of hole portions per observation field.

As shown in Examples described later, it can be seen that the semiconductor layer 10 included in the semiconductor substrate 1 according to the present embodiment has a very low density of threading dislocations and has quality equal to or greater than the quality of a gallium nitride crystal formed by common vapor phase growth. Therefore, it can be seen that the semiconductor layer 10 included in the semiconductor substrate 1 according to the present embodiment has very few crystal defects.

According to the present embodiment, a semiconductor layer 10 formed of a gallium nitride single crystal and having little variation in crystal orientation can be formed on the sapphire substrate 20. The in-plane distribution of crystal orientation of the semiconductor layer 10 can be measured in the following manner, using a crystal orientation analysis function of a scanning electron microscope (SEM).

Specifically, the crystal orientation analysis function of a SEM is a function that observes a micro crystal structure of a sample by means of an electron back scattered diffraction (EBSD) pattern. For example, in the case where a sample is greatly inclined in a SEM and the sample is irradiated with an electron beam, electron beam diffraction occurs in the sample when the sample is in a crystalline form. The crystal orientation can be found by subjecting the electron beam diffraction to indexing of orientation, using a diffraction graphic pattern called a Kikuchi pattern. Further, a crystal orientation map or information of crystal grains of the surface of the sample can be obtained by scanning the sample with an electron beam and mapping Kikuchi patterns.

As shown in Examples described later, in the semiconductor layer 10 included in the semiconductor substrate 1 according to the present embodiment, almost the entire surface of the semiconductor layer 10 is oriented in the c-axis direction of <0 0 0 1>. Therefore, it can be seen that, in the semiconductor layer 10 included in the semiconductor substrate 1 according to the present embodiment, also the crystal orientation is uniformly oriented in the c-axis direction and a good in-plane distribution is obtained.

(Second Characteristic)

Next, the second characteristic possessed by a gallium nitride crystal is described in more detail.

According to the present embodiment, an intermediate layer 11 and a semiconductor layer 10 each formed of a gallium nitride crystal that is doped with iron atoms and yet has few crystal defects can be formed on the sapphire substrate 20.

A gallium nitride crystal is expected to be used for a next-generation functional electronic component such as a light emitting diode, a transistor for a high-frequency power source, or a transistor for a high-voltage power source, for example. When consideration is given to the use for such an electronic component, it is important for the gallium nitride crystal to have semi-insulating properties. Thus, a technology in which a gallium nitride crystal is doped with iron atoms and is thereby provided with semi-insulating properties is studied.

For example, a technology in which a gallium nitride crystal is doped with iron atoms by thermal diffusion is studied. However, this method is batch processing, and is therefore a method yielding low throughput and low productivity. Furthermore, in this method, it is difficult to quantitatively monitor the amount of iron atoms doped in a gallium nitride crystal, and hence it is difficult to dope a gallium nitride crystal with iron atoms uniformly. Furthermore, this method has had the problem that crystal defects are caused to occur in a gallium nitride crystal due to thermally diffused iron atoms.

Further, a technology in which a gallium nitride crystal is doped with iron atoms by ion implantation is studied. However, in this method, the depth and the concentration of ion implantation are influenced by the crystal orientation, and hence it is difficult to dope a gallium nitride crystal with iron atoms uniformly. Furthermore, this method has had the problem that crystal defects are caused to occur in a gallium nitride crystal due to the implantation of ions.

In the semiconductor substrate 1 according to the present embodiment, gallium nitride crystals that form the intermediate layer 11 and the semiconductor layer 10 are formed by liquid phase growth using a melt obtained by melting iron nitride, which contains iron atoms, and metal gallium. Therefore, according to the present embodiment, a gallium nitride crystal in which iron atoms have been spontaneously incorporated into the crystal in the course of crystal growth can be formed uniformly.

Specifically, each of the gallium nitride crystals that form the intermediate layer 11 and the semiconductor layer 10 may contain iron atoms in a concentration of more than or equal to $1.0 \times 10^{16}$ atoms/cm$^3$ and less than or equal to $1.0 \times 10^{22}$ atoms/cm$^3$.

However, the desired insulating properties of the gallium nitride crystal formed in the semiconductor substrate 1 vary with the use. Hence, the gallium nitride crystal formed in the semiconductor substrate 1 may contain iron atoms in an appropriate concentration in accordance with the use. For example, in low resistance uses, the gallium nitride crystal of the semiconductor substrate 1 may contain iron atoms in a concentration of more than or equal to $1.0 \times 10^{16}$ atoms/cm$^3$ and less than or equal to $1.0 \times 10^{19}$ atoms/cm$^3$. Further, in high resistance uses, the gallium nitride crystal of the semiconductor substrate 1 may contain iron atoms in a concentration of more than or equal to $1.0 \times 10^{17}$ atoms/cm$^3$ and less than or equal to $1.0 \times 10^{22}$ atoms/cm$^3$.

More specifically, the concentration distribution of iron atoms of each of the gallium nitride crystals that form the intermediate layer 11 and the semiconductor layer 10 may have a bathtub shape in the thickness direction of the gallium nitride crystal, and may be included in the range of more than or equal to $1.0 \times 10^{16}$ atoms/cm$^3$ and less than or equal to $1.0 \times 10^{22}$ atoms/cm$^3$.

The bathtub shape is a shape in which a central portion is flat and both end portions are raised. That is, the concentration of iron atoms of the gallium nitride crystal may have a distribution in which, in the thickness direction of the gallium nitride crystal, the concentration of iron atoms is higher in a surface region of the gallium nitride crystal and an interface region with the sapphire substrate 20 and the concentration of iron atoms is lower in an intermediate region between the surface region and the interface region.

As reasons why the concentration distribution of iron atoms takes such a shape in the thickness direction of the gallium nitride crystal, the following reasons may be given.

The gallium nitride crystal in the interface region with the sapphire substrate 20 corresponds to an early stage of the growth of the gallium nitride crystal. Therefore, it is presumed that the gallium nitride crystal in the interface region with the sapphire substrate 20 incorporates a larger amount of iron atoms into the crystal in order to solve mismatching between the crystal lattices of the sapphire substrate 20 and gallium nitride. Further, the gallium nitride crystal in the surface region serves as a starting point of the growth of the gallium nitride crystal on the sapphire substrate 20. Therefore, it is presumed that, in association with the production of the gallium nitride crystal, the gallium nitride crystal in the surface region incorporates a larger amount of iron atoms, which are a catalyst of the production of a gallium nitride crystal, into the crystal. On the other hand, it is presumed that the gallium nitride crystal in the intermediate region between the interface region and the surface region grows by crystal growth at a constant rate, and hence incorporates iron atoms into the crystal in a substantially constant concentration.

For example, in the thickness direction of the gallium nitride crystal, the concentration distribution of iron atoms may be a distribution in which the highest value of the concentration of iron atoms in the interface region with the sapphire substrate 20 is more than or equal to 10 times the lowest value of the concentration of iron atoms in the intermediate region. Further, the concentration distribution of iron atoms may be a distribution in which the highest value of the concentration of iron atoms in the surface region of the gallium nitride crystal is more than or equal to 10 times the lowest value of the concentration of iron atoms in the intermediate region.

In a gallium nitride crystal that is formed on the semiconductor substrate 1 by growing a gallium nitride crystal by liquid phase growth from a melt obtained by melting iron nitride and metal gallium, the concentration distribution of iron atoms contained may be the distribution described above. Thereby, the gallium nitride crystal formed on the semiconductor substrate 1 can contain iron atoms without producing crystal defects.

The concentration of iron atoms in the gallium nitride crystal can be controlled by the amount of iron nitride added to the melt at the time of liquid phase growth, for example. Specifically, the concentration of iron atoms in the gallium nitride crystal can be increased overall by increasing the amount of iron nitride added to the melt at the time of liquid phase growth. Conversely, the concentration of iron atoms in the gallium nitride crystal can be reduced overall by reducing the amount of iron nitride added to the melt at the time of liquid phase growth. Further, the concentration of iron atoms in the gallium nitride crystal can be controlled by adjusting the rate of growth of the gallium nitride crystal at the time of liquid phase growth. This is because, by adjusting the rate of growth of the gallium nitride crystal, the rate of incorporation of iron atoms into the gallium nitride crystal and the rate of discharge of impurities from the gallium nitride crystal can be controlled.

Here, the concentration distribution of iron atoms of the gallium nitride crystal in the intermediate region has high uniformity because iron atoms are incorporated into the crystal at a substantially constant rate. For example, in the thickness direction of the gallium nitride crystal, the difference between the concentrations of iron atoms at arbitrary two points in the intermediate region may be less than or equal to 50% of the concentration of iron atoms at either one of the arbitrary two points. That is, in the thickness direction of the gallium nitride crystal, the variation in the concentration of iron atoms of the gallium nitride crystal in the intermediate region is very small and uniform as compared to the rising of the concentration of iron atoms in the interface region or the surface region.

Further, in the semiconductor substrate 1 according to the present embodiment, the concentration distribution of iron atoms of the gallium nitride crystal has high uniformity also in the in-plane direction of the gallium nitride crystal. For example, in the in-plane direction of the gallium nitride crystal, the difference between the concentrations of iron atoms at arbitrary two points in the intermediate region may be less than or equal to 50% of the concentration of iron atoms at either one of the arbitrary two points. That is, in the in-plane direction of the gallium nitride crystal, the variation in the concentration of iron atoms of the gallium nitride crystal in the intermediate region is very small and uniform as compared to the rising of the concentration of iron atoms in the interface region or the surface region, like in the thickness direction of the gallium nitride crystal.

Thus, according to the present embodiment, an intermediate layer 11 and a semiconductor layer 10 each formed of a gallium nitride crystal doped with iron atoms can be formed without causing crystal defects to occur. Furthermore, according to the present embodiment, iron atoms can be doped into the gallium nitride crystal in the intermediate region between the surface region of the gallium nitride crystal and the interface region with the sapphire substrate 20 in a substantially uniform concentration.

The interface region in the gallium nitride crystal refers to a region up to the place where, in the thickness direction of the gallium nitride crystal, the rising of the concentration distribution of iron atoms at the interface between the gallium nitride crystal and the sapphire substrate 20 has subsided and the concentration distribution becomes substantially constant. The interface region in the gallium nitride crystal may be, for example, a region within 2 μm from the interface with the sapphire substrate 20 in the thickness direction of the gallium nitride crystal. Further, the surface region in the gallium nitride crystal refers a region up to the place where, in the thickness direction of the gallium nitride crystal, the rising of the concentration distribution of iron atoms at the surface of the gallium nitride crystal has subsided and the concentration distribution becomes substantially constant. The surface region in the gallium nitride crystal may be, for example, a region within 1 μm from the surface of the gallium nitride crystal in the thickness direction of the gallium nitride crystal.

<3. Method for Producing Gallium Nitride Crystal>

Next, a method for producing a gallium nitride single crystal included in a semiconductor substrate according to an embodiment of the present invention is described.

The method for producing a gallium nitride single crystal according to the present embodiment is a method in which a single crystal film of gallium nitride (the semiconductor layer 10) is produced on the sapphire substrate 20 via the intermediate layer 11 by heating and melting metal gallium and iron nitride and using the nitriding action of iron nitride. By the method mentioned above, a gallium nitride single crystal can be grown on a sapphire substrate by liquid phase epitaxial growth in an environment of a lower pressure (for example, normal pressure) than in conventional liquid phase growth.

(Reaction Materials)

First, reaction materials used in the method for producing a gallium nitride single crystal according to the present embodiment are described. As reaction materials, metal gallium and iron nitride are used.

As the metal gallium, one with a high purity is preferably used; for example, a commercially available one with a purity of more than or equal to 99.99% may be used.

As the iron nitride, specifically, tetrairon mononitride ($Fe_4N$), triiron mononitride ($Fe_3N$), or diiron mononitride ($Fe_2N$), or a mixture of two or more of these may be used. As the iron nitride, one with a high purity is preferably used; for example, a commercially available one with a purity of more than or equal to 99.9% may be used.

Iron atoms in the iron nitride function as a catalyst by being mixed with metal gallium and being heated, and produce active nitrogen from nitrogen atoms in the iron nitride or nitrogen molecules in the melt. The produced active nitrogen reacts with metal gallium, and thereby produces a gallium nitride crystal.

Specifically, in the case where tetrairon mononitride is used as the iron nitride, the iron nitride and metal gallium react together by the nitriding action of tetrairon mononitride, and produce gallium nitride (Reaction Formula 1).

$$Fe_4N + 13Ga \rightarrow GaN + 4FeGa_3 \qquad \text{Reaction Formula 1}$$

Further, nitrogen that has been dissolved into the melt from the nitrogen atmosphere, iron nitride, and metal gallium react together by iron atoms functioning as a catalyst, and produce gallium nitride (Reaction Formula 2).

$$2Ga + N_2 + Fe \rightarrow 2GaN + Fe \qquad \text{Reaction Formula 2}$$

The ratio of iron nitride in the reaction materials is preferably less than or equal to 2 mol % relative to the total mole number of metal gallium and iron nitride. If the ratio of iron nitride is more than 2 mol %, the amount of formed alloy of iron atoms in the iron nitride and metal gallium is increased and accordingly the viscosity of the melt obtained by melting the reaction materials is increased, and consequently the rate of growth of a gallium nitride crystal is reduced; thus, this is not preferable.

(Reaction Apparatus)

Next, a reaction apparatus used in a method for producing a gallium nitride single crystal according to the present embodiment is described with reference to FIG. 3. FIG. 3 is a schematic diagram describing the configuration of a reaction apparatus used for the production of a gallium nitride single crystal.

As shown in FIG. 3, a reaction apparatus 100 includes an electric furnace 113, a heater 114 provided on the side surface of the electric furnace 113, a gas introduction port 131, a gas exhaust port 132, a lifting shaft 122, and a sealing material 123 that ensures airtightness between the lifting shaft 122 and the electric furnace 113. A base 112 on which a reaction vessel 111 in which a source material melt 110 of reaction materials is put is mounted is provided in the interior of the electric furnace 113, and a holder 120 that holds a substrate 140 on which a gallium nitride crystal is to be grown is provided at one end of the lifting shaft 122. That is, the reaction apparatus 100 is an apparatus that epitaxially grows a crystal film of gallium nitride on the substrate 140 that is immersed in a source material melt 110 obtained by melting reaction materials.

The electric furnace 113 has a sealed-up structure, and houses the reaction vessel 111 in the interior. For example, the electric furnace 113 may be a cylindrical structure with an inner diameter (diameter) of approximately 200 mm and a height of approximately 800 mm. The heater 114 is placed on the side surface in the longitudinal direction of the electric furnace 113, and heats the interior of the electric furnace 113.

The gas introduction port 131 is provided in a lower portion of the electric furnace 113, and introduces an atmosphere gas (for example, nitrogen ($N_2$) gas) into the interior of the electric furnace 113. The gas exhaust port 132 is provided in an upper portion of the electric furnace 113, and exhausts the atmosphere gas of the interior of the electric furnace 113. By the gas introduction port 131 and the gas exhaust port 132, the pressure of the interior of the electric furnace 113 is kept to be approximately normal pressure (that is, atmospheric pressure).

The base 112 is a member that supports the reaction vessel 111. Specifically, the base 112 supports the reaction vessel 111 in such a manner that the reaction vessel 111 is equally heated by the heater 114. For example, the height of the base 112 may be a height whereby the reaction vessel 111 is located on a central portion of the heater 114.

The reaction vessel 111 is a vessel that holds a source material melt 110 obtained by melting reaction materials. The reaction vessel 111 may be a vessel of a circular cylindrical shape with an outer diameter (diameter) of approximately 100 mm, a height of approximately 90 mm, and a thickness of approximately 5 mm, for example. The reaction vessel 111 is formed of, for example, carbon, but may be formed of another material such as aluminum oxide as long as it is a material that does not react with metal gallium at high temperatures around 1000° C.

The source material melt 110 is a liquid obtained by melting reaction materials. Specifically, the source material melt 110 is a liquid obtained by heating and melting metal gallium and iron nitride, which are reaction materials, with the heater 114. For the mixing ratio between metal gallium and iron nitride, which are reaction materials, it is preferable that the mole number of iron nitride be less than or equal to 2% relative to the total mole number of metal gallium and iron nitride, as described above.

The substrate 140 is a substrate on a surface of which a crystal film of gallium nitride can be stacked. The substrate 140 may be specifically a sapphire substrate. The shape of the substrate 140 may be any shape; for example, may be a substantially flat plate-like shape, a substantially circular plate-like shape, or the like.

The sealing material 123 is provided between the lifting shaft 122 and the electric furnace 113, and ensures the airtightness of the interior of the electric furnace 113. Since an event in which the air outside the electric furnace 113 flows into the electric furnace 113 is prevented by the sealing material 123, the interior of the electric furnace 113 is made to be a gas atmosphere (for example, nitrogen ($N_2$) atmosphere) introduced from the gas introduction port 131.

The lifting shaft 122 immerses the substrate 140 in the source material melt 110, and lifts the substrate 140 from the source material melt 110. Specifically, the lifting shaft 122 is provided to pierce the upper surface of the electric furnace 113. The holder 120 that holds the substrate 140 is provided at one end of the lifting shaft 122 in the interior of the electric furnace 113. Therefore, the substrate 140 held by the holder 120 can be immersed in the source material melt 110 and be lifted by raising and lowering the lifting shaft 122.

The lifting shaft 122 may be provided to be rotatable about the shaft. In such a case, by rotating the lifting shaft 122, the holder 120 and the substrate 140 can be rotated, and the source material melt 110 can be stirred. Thereby, the nitrogen concentration distribution in the source material melt 110 can be made more uniform, and accordingly a more uniform single crystal film of gallium nitride can be grown on the substrate 140.

The holder 120 includes a plurality of hooks, and holds the substrate 140 horizontally. By holding the substrate 140 horizontally, the influence of the nitrogen concentration distribution in the depth direction of the source material melt 110 on the substrate 140 can be reduced. The holder 120 may be formed of carbon similarly to the reaction vessel 111, but may be formed of another material such as aluminum oxide as long as it is a material that does not react with metal gallium even at high temperatures around 1000° C.

By the above configuration, the reaction apparatus 100 can immerse the substrate 140 in the source material melt 110 by raising and lowering the lifting shaft 122, and can grow a single crystal film of gallium nitride on the substrate 140.

Here, a more specific shape of the holder 120 is described with reference to FIG. 4. FIG. 4 is a perspective view showing the holder 120 for the substrate 140 shown in FIG. 3 more specifically.

As shown in FIG. 4, the holder 120 has a structure in which both ends of prop portions 126 and 127 that are two columnar members are linked together by beam portions 124 and 125. At least one or more shelf boards 128 are provided in the space formed by the prop portions 126 and 127 and the beam portions 124 and 125. The shelf board 128 holds the substrate 140 horizontally by being provided perpendicularly to the prop portions 126 and 127.

The holder 120 may include a plurality of shelf boards 128. In such a case, the holder 120 allows crystal films of gallium nitride to be synthesized on a plurality of substrates 140 by simultaneously immersing the plurality of substrates 140 in the source material melt 110 in the reaction vessel 111. The spacing between shelf boards 128 may be approximately 10 mm, for example.

By the above configuration, the reaction apparatus 100 can cause a crystal film of gallium nitride with a crystal orientation coinciding with the crystal orientation of the substrate 140 (that is, epitaxially grown) to be stacked on the substrate 140.

(Reaction Process)

Next, a flow of a method for producing a gallium nitride single crystal according to the present embodiment is described.

First, powders of metal gallium and iron nitride are mixed together and are put into the reaction vessel 111 described above, and the reaction vessel 111 is mounted in the electric furnace 113.

Subsequently, nitrogen gas is introduced into the electric furnace 113 from the gas introduction port 131, and the interior of the electric furnace 113 is set to a nitrogen atmosphere; then, the reaction materials in the reaction vessel 111 are heated by the heater 114. Nitrogen gas that has been introduced into the electric furnace 113 from the gas introduction port 131 is exhausted from the gas exhaust port 132, and thus the interior of the electric furnace 113 is kept at approximately normal pressure.

Here, the reaction materials in the reaction vessel 111 are heated to at least a reaction temperature at which metal gallium and iron nitride react together. Such a reaction temperature is specifically more than 700° C. and less than or equal to 1000° C.

It is preferable that the reaction materials in the reaction vessel 111 be held at a temperature within the range of reaction temperature described above for more than or equal to 20 hours during the time when a gallium nitride single crystal is being grown on the substrate 140. During the time when the temperature is held, the temperature of the reaction materials does not need to be constant and may vary as long as it is within the range of reaction temperature (for example, more than 700° C. and less than or equal to 1000° C.).

After the reaction materials in the reaction vessel 111 melt and become the source material melt 110, the lifting shaft 122 is operated, and thereby the substrate 140 held by the holder 120 is immersed in the source material melt 110. Thereby, a uniform single crystal film of gallium nitride can be grown on the substrate 140 immersed in the source material melt 110.

However, there is a case where a by-product such as an intermetallic compound of iron and gallium is contained in a reaction product obtained by the process mentioned above. Thus, the substrate 140 on which a gallium nitride crystal has been precipitated may be subjected to a purification process, and thereby the by-product is removed.

The purification process may use acid washing using an acid such as aqua regia, for example. Thus, the gallium nitride single crystal can be purified by dissolving an intermetallic compound of iron and gallium or the like in an acid.

By the above process, a gallium nitride single crystal can be produced efficiently by liquid phase growth in a nitrogen atmosphere of low pressure such as normal pressure.

EXAMPLES

In the following, the semiconductor substrate, the gallium nitride single crystal, and the method for producing a gallium nitride single crystal according to the present embodiment are specifically described with reference to Examples and Comparative Examples. Examples shown below are only examples, and the semiconductor substrate, the gallium nitride single crystal, and the method for producing a gallium nitride single crystal according to the present embodiment are not limited to the examples described below.

In Examples and Comparative Examples below, in common, metal gallium with a purity of 7N (produced by Dowa Electronics Materials CO., LTD.) and triiron mononitride with a purity of more than or equal to 99% (produced by Kojundo Chemical Lab. Co., Ltd.) were used. Further, as a crystal growth substrate, a sapphire substrate in which the diameter was approximately 2 inches, the thickness was 0.4 mm, and the plane orientation of the surface on which a single crystal film of gallium nitride was to be stacked was the c-plane (0 0 0 1), the a-plane (1 1 −2 0), or the r-plane (1 −1 0 2) (produced by Shinkosha Co., Ltd.) was used.

Example 1

First, source materials of metal gallium (Ga) and triiron mononitride ($Fe_3N$) were mixed together at a ratio of Ga:$Fe_3N$=99.8 mol %:0.2 mol %, and were put into a reaction vessel placed in the interior of a reaction apparatus. Further, a sapphire substrate in which the plane orientation of the surface on which the semiconductor layer was to be formed was the c-plane (0 0 0 1) was mounted on a shelf board of a holder.

Subsequently, the internal temperature of the reaction apparatus was controlled in accordance with the following temperature profile, and thereby metal gallium and triiron mononitride were reacted together; thus, a gallium nitride single crystal was produced.

Specifically, first, the internal temperature of the reaction apparatus was increased to 200° C. manually, and then the internal temperature was raised to 700° C. at a rate of 100° C. per hour. After that, the internal temperature of the reaction apparatus was held at 700° C. for 20 hours, was then raised to 900° C. at a rate of 100° C. per hour, and was held at 900° C. for 40 hours. At this time, the holder was rotated about the lifting shaft as the axis at a rate of 10 rotations per minute, and thereby the melt was stirred. After that, natural cooling was performed by natural heat dissipation until the interior of the reaction vessel returned to room temperature, then the sapphire substrate was taken out, and the sapphire substrate was cleaned with aqua regia and thereby the remaining metal gallium, intermetallic compound of iron and gallium, etc. were removed.

Figure 5A:
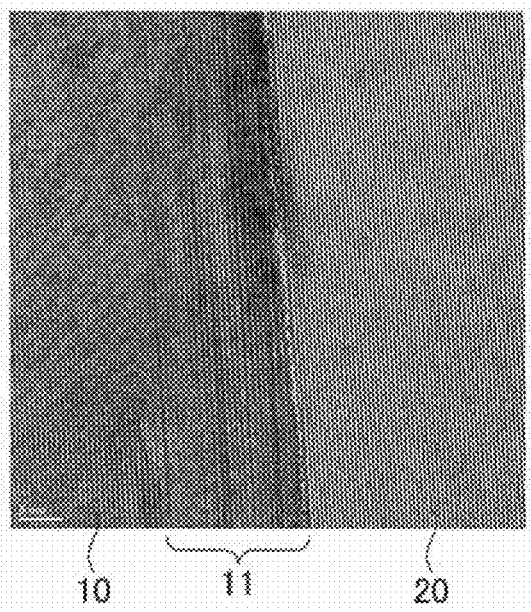
FIG. 5A is a TEM bright field image in which a cross section near an interface between a sapphire substrate, and an intermediate layer and a semiconductor layer of a semiconductor substrate according to Example 1 is observed.

A cross section of the semiconductor substrate according to Example 1 was observed with a tunnel electron microscope (TEM) etc., and it was found that an intermediate layer and a semiconductor layer each formed of a gallium nitride single crystal were formed on the sapphire substrate. The result is shown in FIG. 5A. FIG. 5A is a TEM bright field image in which a cross section around the interface between the sapphire substrate, and the intermediate layer and the semiconductor layer of the semiconductor substrate according to Example 1 is observed.

In FIG. 5A, facing the drawing sheet, the slightly bright region on the right side is the sapphire substrate 20, and the slightly dark region on the left side is gallium nitride crystals (the intermediate layer 11 and the semiconductor layer 10). As shown in FIG. 5A, it can be seen that an intermediate layer 11 in which the alignment of lattice is disordered has been formed with a thickness of approximately 20 nm at the interface between the sapphire substrate 20 and the gallium nitride crystal.

Subsequently, the sapphire substrate on which the intermediate layer and the semiconductor layer (gallium nitride crystal films) according to Example 1 were stacked was subjected to the tilt measurement and the twist measurement described above. The measurement results are shown in FIG. 6A and FIG. 6B.

Figure 6A:
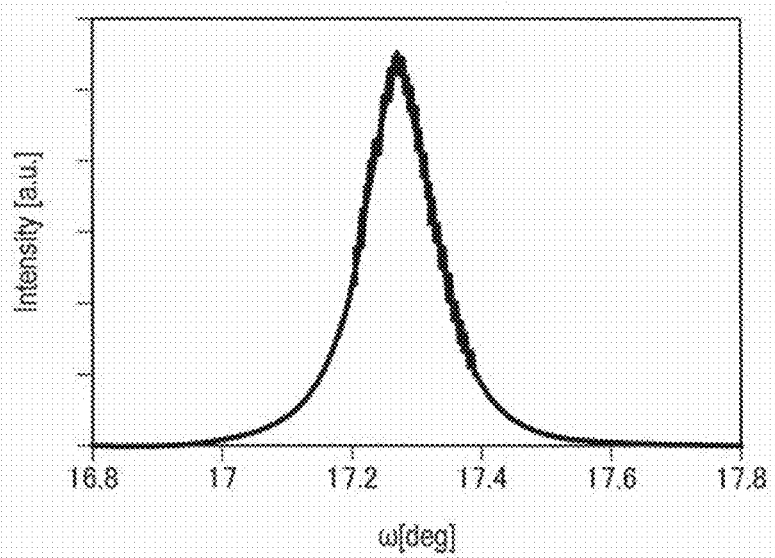
FIG. 6A is a result of tilt measurement of a single crystal that forms the semiconductor layer of the semiconductor substrate according to Example 1.
Figure 6B:
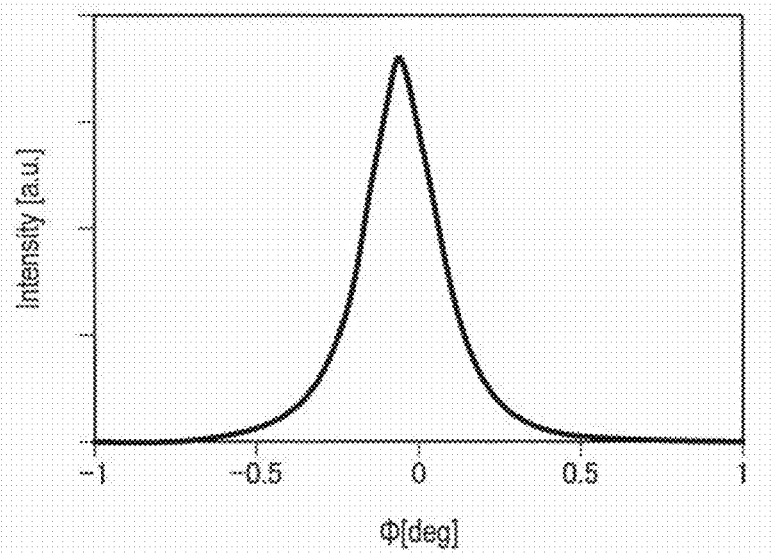
FIG. 6B is a result of twist measurement of the single crystal that forms the semiconductor layer of the semiconductor substrate according to Example 1.

FIG. 6A is the result of tilt measurement of the gallium nitride crystals that form the intermediate layer and the semiconductor layer of the semiconductor substrate according to Example 1. Tilt measurement ($\omega$-scanning) measures the change or variation in crystal orientation in the stacking direction of the crystal, and shows that, the narrower the width of the peak is, the smaller the variation in crystal orientation is, and the better the crystallinity is.

The fully automatic horizontal multipurpose X-ray analysis apparatus, "SmartLab 3XG," manufactured by Rigaku Corporation described above was used to perform measurement based on $\omega$-scanning, by using an arrangement in which the detection of incidence and diffraction of X-rays was performed in a plane perpendicular to the surface of the sample and placing the detector at $2\theta=34.6°$ (the value calculated from the distance between lattice planes of (0 0 0 2) of gallium nitride by using Bragg's equation). The entry depth of X-rays to the sample at this time is approximately several tens of micrometers.

As shown in FIG. 6A, a peak was observed around $\omega=17.3$ degrees. The full width at half maximum (tilt width) of intensity of the peak was 0.13°.

FIG. 6B is the result of twist measurement of the gallium nitride crystals that form the intermediate layer and the semiconductor layer of the semiconductor substrate according to Example 1. Twist measurement ($\varphi$-scanning) measures the change or variation in crystal orientation in the in-plane direction of the crystal, and shows that, the narrower the width of the peak is, the smaller the variation in crystal orientation is, and the better the crystallinity is.

The fully automatic horizontal multipurpose X-ray analysis apparatus, "SmartLab 3XG," manufactured by Rigaku Corporation described above was used to cause X-rays to be incident on the surface of the sample at a very shallow angle, by using an arrangement in which the detection of incidence and diffraction of X-rays was performed in the plane of the surface of the sample. The entry depth of X-rays to the sample at this time is approximately several micrometers. In twist measurement, measurement based on $\varphi$-scanning was performed by using, as conditions of the measuring optical system, an angle of incidence of 0.25°, a width of an incidence slit of 0.1 mm, and a width of a length limiting slit of 5 mm and placing the detector at $2\theta_\chi=57.91°$ (the value calculated from the distance between lattice planes of (1 1 −2 0) of gallium nitride by using Bragg's equation). As a result, an intensity peak was observed in each of positions of 6-fold symmetry (at intervals of 60° in in-plane rotation).

In twist measurement, which is in-plane measurement, the $\omega$-axis is a relative value, and hence the position of the highest point of the peak is shown as $\omega=0°$. As shown in FIG. 6B, the full width at half maximum (twist width) of intensity of the peak was 0.42°. Further, the intensity value of the gallium nitride (1 1 −2 0) plane in twist measurement was 7×10⁴ cps.

Example 2

A gallium nitride single crystal was grown on a sapphire substrate by a similar method to Example 1 except that the temperature profile was set to the following conditions.

Specifically, first, the internal temperature of the reaction apparatus was increased to 200° C. manually, and then the internal temperature was raised to 780° C. at a rate of 100° C. per hour. Next, the internal temperature of the reaction apparatus was held at 780° C. for 40 hours. After that, natural cooling was performed by natural heat dissipation until the interior of the reaction vessel returned to room temperature.

A cross section of the semiconductor substrate according to Example 2 was observed with a SEM, a TEM, etc., and it was found that, like in Example 1, an intermediate layer and a semiconductor layer each formed of a gallium nitride crystal were stacked on the sapphire substrate (not shown).

The sapphire substrate on which the intermediate layer and the semiconductor layer (gallium nitride crystal films) according to Example 2 were stacked was subjected to tilt measurement and twist measurement like in Example 1. As a result, it was found that the tilt width was 0.33° and the twist width was 0.66°. Further, the intensity value of the gallium nitride (1 1 −2 0) plane in twist measurement was 2×10⁴ cps.

Example 3

A gallium nitride single crystal was grown on a sapphire substrate by a similar method to Example 1 except that a sapphire substrate in which the plane orientation of the surface on which the semiconductor layer was to be formed was the a-plane (1 1 −2 0) was used.

X-ray analysis has shown that, on the sapphire substrate on which the intermediate layer and the semiconductor layer (gallium nitride crystal films) according to Example 3 are formed, a gallium nitride single crystal of the (0 0 0 1) plane has grown parallel to the surface of the sapphire substrate.

A cross section of the semiconductor substrate according to Example 3 was observed with a SEM, a TEM, etc., and it was found that, like in Example 1, an intermediate layer and a semiconductor layer each formed of a gallium nitride crystal were stacked on the sapphire substrate (not shown).

The sapphire substrate on which the intermediate layer and the semiconductor layer (gallium nitride crystal films) according to Example 3 were formed was subjected to tilt measurement and twist measurement like in Example 1. As a result, it was found that the tilt width was 0.15° and the twist width was 0.54°. Further, the intensity value of the gallium nitride (1 1 −2 0) plane in twist measurement was 5×10⁴ cps.

Comparative Example 1

A gallium nitride single crystal was grown on a sapphire substrate by a similar method to Example 1 except that the temperature profile was set to the following conditions.

Specifically, first, the internal temperature of the reaction apparatus was increased to 200° C. manually, and then the internal temperature was raised to 620° C. at a rate of 100° C. per hour. Next, the internal temperature of the reaction apparatus was held at 620° C. for 10 hours, was then raised to 680° C. at a rate of 0.5° C. per hour, and was held at 680° C. for 3 hours. After that, natural cooling was performed by natural heat dissipation until the interior of the reaction vessel returned to room temperature.

A cross section of the semiconductor substrate according to Comparative Example 1 was observed with a SEM, and it was found that crystal grains of gallium nitride were formed discretely on the sapphire substrate, in island-like shapes each having a size of approximately several micrometers to several tens of micrometers (not shown).

Figure 5B:
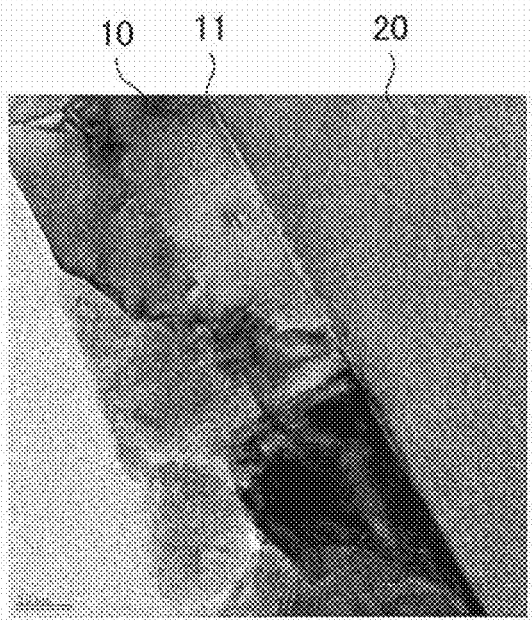
FIG. 5B is a TEM bright field image in which a cross section near an interface between a sapphire substrate, and an intermediate layer and a semiconductor layer of a semiconductor substrate according to Comparative Example 1 is observed.

Further, a cross section of the semiconductor substrate according to Comparative Example 1 was observed with a TEM; the result is shown in FIG. 5B. FIG. 5B is a TEM bright field image in which a cross section around the interface between the sapphire substrate, and the intermediate layer and the semiconductor layer of the semiconductor substrate according to Comparative Example 1 is observed.

In FIG. 5B, facing the drawing sheet, the slightly bright region on the right side is the sapphire substrate 20, and the slightly dark region on the left side is a gallium nitride crystal (the semiconductor layer 10). As shown in FIG. 5B, in the cross section of the semiconductor substrate according to Comparative Example 1, the gallium nitride crystal was in a polycrystalline form, and the orientations of crystal grains were in a random manner. It has been found that the intermediate layer 11 is not clearly observed or has formed a very thin film and only the semiconductor layer 10 is formed on the sapphire substrate 20.

The sapphire substrate on which the semiconductor layer (a gallium nitride single crystal film) according to Comparative Example 1 was formed was subjected to tilt measurement and twist measurement like in Example 1. As a result, it was found that the tilt width was 0.40° and the twist width was 1.18°. Further, the intensity value of the gallium nitride (1 1 −2 0) plane in twist measurement was 5×10² cps.

Comparative Example 2

A gallium nitride single crystal was grown on a sapphire substrate by a similar method to Example 1 except that the temperature profile was set to the following conditions.

Specifically, first, the internal temperature of the reaction apparatus was increased to 200° C. manually, and then the internal temperature was raised to 700° C. at a rate of 100° C. per hour. Next, the internal temperature of the reaction apparatus was held at 700° C. for 40 hours, was then raised to 900° C. at a rate of 100° C. per hour, and was held at 900° C. for 3 hours. After that, natural cooling was performed by natural heat dissipation until the interior of the reaction vessel returned to room temperature.

A cross section of the semiconductor substrate according to Comparative Example 2 was observed with a SEM, a TEM, etc., and it was found that, like in Comparative Example 1, gallium nitride crystal grains were formed discretely on the sapphire substrate, in island-like shapes each having a size of approximately several micrometers to several tens of micrometers. Hence, it has been found that, in the semiconductor substrate according to Comparative Example 2, a gallium nitride crystal in a polycrystalline form and with random orientations of crystal grains is formed, and the intermediate layer is not clearly observed and only the semiconductor layer is formed (not shown).

The sapphire substrate on which the semiconductor layer (a gallium nitride crystal film) according to Comparative Example 2 was formed was subjected to tilt measurement and twist measurement like in Example 1. As a result, it was found that the tilt width was 0.51° and the twist width was 0.59°. Further, the intensity value of the gallium nitride (1 1 −2 0) plane in twist measurement was 1×10³ cps.

Comparative Example 3

A gallium nitride single crystal was grown on a sapphire substrate by a similar method to Example 1 except that a sapphire substrate in which the plane orientation of the surface on which the semiconductor layer was to be formed was the r-plane (1 −1 0 2) was used.

A cross section of the semiconductor substrate according to Comparative Example 3 was observed with a SEM, a TEM, etc., and it was found that, like in Comparative Example 1, gallium nitride crystal grains were formed discretely on the sapphire substrate, in island-like shapes each having a size of approximately several micrometers to several tens of micrometers. Hence, it has been found that, in the semiconductor substrate according to Comparative Example 3, a gallium nitride crystal in a polycrystalline form and with random orientations of crystal grains is formed, and the intermediate layer is not clearly observed and only the semiconductor layer is formed (not shown).

X-ray analysis has shown that, on the sapphire substrate on which the semiconductor layer (a gallium nitride crystal film) according to Comparative Example 3 is formed, a gallium nitride single crystal of the (0 0 0 1) plane has grown parallel to the surface of the sapphire substrate, although the X-ray diffraction intensity is weak.

The sapphire substrate on which the semiconductor layer (a gallium nitride crystal film) according to Comparative Example 3 was formed was subjected to tilt measurement and twist measurement like in Example 1. As a result, it was found that the tilt width was 0.69° and the twist width was 2°. Further, the intensity value of the gallium nitride (1 1 −2 0) plane in twist measurement was 3×10² cps.

The results of the tilt widths and the twist widths measured in Examples 1 to 3 and Comparative Examples 1 to 3 above and the intensity values of the gallium nitride (1 1 −2 0) plane in twist measurement are collectively shown in Table 1 below and FIG. 7. FIG. 7 is a scatter diagram showing a correlation between the tilt width and the twist width.

TABLE 1

|  | Tilt width GaN(0 0 0 2) [deg.] | Twist width GaN(1 1 −2 0) [deg.] | GaN(1 1 −2 0) peak intensity relative value [cps] |
| --- | --- | --- | --- |
| Example 1 | 0.13 | 0.42 | 7 × 10⁴ |
| Example 2 | 0.33 | 0.66 | 2 × 10⁴ |
| Example 3 | 0.15 | 0.54 | 5 × 10⁴ |
| Comparative Example 1 | 0.40 | 1.18 | 5 × 10² |
| Comparative Example 2 | 0.51 | 0.59 | 1 × 10³ |
| Comparative Example 3 | 0.69 | 2 | 3 × 10² |

The tilt width is an index indicating the crystallinity in the stacking direction of a crystal (the level of uniformity of crystal orientation in the stacking direction); the smaller the value is, the better the crystallinity is. The tilt width is determined as good when it is less than or equal to approximately 0.4°. Further, the twist width is an index indicating the crystallinity in the in-plane direction of a crystal (the level of uniformity of crystal orientation in the in-plane direction); the smaller the value is, the better the crystallinity is. The twist width is determined as good when it is less than or equal to approximately 0.7°.

When the results of Table 1 are referred to, it can be seen that, in Examples 1 to 3, the tilt width and the twist width are small, and hence a single crystal having good orientation properties and good crystallinity both in the stacking direction and in the in-plane direction has been formed.

In Examples 1 to 3 and Comparative Examples 1 to 3, the values of peak intensity can be relatively compared because the X-ray irradiation region was set in agreement while conditions of the measuring optical system, such as the angle of incidence, the width of an incidence slit, and the width of a length limiting slit, were standardized. Therefore, it is surmised that, the larger the peak intensity relative value of gallium nitride (1 1 −2 0) in twist measurement is, the larger the volume (the average thickness) of the gallium nitride crystal film oriented in the (1 1 −2 0) plane is.

Thus, it can be seen that Examples 1 to 3 exhibit good crystallinity, because the tilt width is in the range of 0.13° to 0.33° and the twist width is in the range of 0.42° to 0.66°. Further, it is surmised that, in Examples 1 to 3, a crystal film of gallium nitride with a sufficient volume (thickness) has been formed successfully, because the peak intensity relative value in twist measurement is more than or equal to 10⁴ cps.

On the other hand, it can be seen that, in Comparative Examples 1 to 3, both the tilt and the twist have large variations in crystal orientation, because the tilt width is in the range of 0.40° to 0.69° and the twist width is in the range of 0.59° to 2°. Further, it is surmised that, in Comparative Examples 1 to 3, a crystal film of gallium nitride with a sufficient volume (thickness) has not been formed, because the peak intensity relative value in twist measurement is less than or equal to 10³ cps.

Further, when Examples 1 and 3 and Comparative Example 3 are compared, it can be seen that, even when the same temperature profile conditions are used, differences occur between the crystal films of gallium nitride formed, due to the fact that the plane orientations of the surfaces of the sapphire substrates on which gallium nitride crystals are formed are different.

Specifically, in the case where the plane orientation of the surface of the sapphire substrate on which a gallium nitride crystal was formed was any of the c-plane (0 0 0 1), the a-plane (1 1 −2 0), and the r-plane (1 −1 0 2), gallium nitride of the (0 0 0 1) plane was formed parallel to the surface of the sapphire substrate.

However, it can be seen that, in the case where the plane orientation of the sapphire substrate is the c-plane (0 0 0 1) and the a-plane (1 1 −2 0) as in Examples 1 and 3, both the tilt width and the twist width are small and the peak intensity relative value in twist measurement is large. Therefore, it is surmised that, in Examples 1 and 3, a single crystal having good orientation properties and good crystallinity both in the stacking direction and in the in-plane direction has been formed, and a single crystal film of gallium nitride with a sufficient volume (thickness) has been formed.

On the other hand, it can be seen that, in the case where the plane orientation of the sapphire substrate is the r-plane (1 −1 0 2) as in Comparative Example 3, both the tilt width and the twist width are large and the peak intensity relative value in twist measurement is small. Therefore, it is surmised that, in Comparative Example 3, both the tilt and the twist have large variations in crystal orientation, and a crystal film of gallium nitride with a sufficient volume (thickness) has not been formed.

(Assessment of in-Plane Distribution of Crystallinity)

Subsequently, the in-plane distribution of crystallinity of the single crystal film of gallium nitride (the semiconductor layer) formed on the sapphire substrate was assessed in Example 1 and Comparative Example 2.

Specifically, in X-ray diffraction, measurement was performed using an out-of-plane arrangement in which the detection of incidence and diffraction of X-rays was performed in a plane perpendicular to the surface of the sample. However, a sample horizontal multipurpose X-ray diffraction apparatus, UltimalV-MAJ (manufactured by Rigaku Corporation), was used, and an optical element of a light collecting optical system for micro-crystalline diffraction, CBO-f, and an attachment of a sample stage of micro-crystalline diffraction were used. Further, a Cu tube was used, X-rays were applied under conditions of a voltage of 40 kV and a current of 40 mA, and a divergence vertical slit was set to 2 mm. The X-ray irradiation region in the surface of the sample was an elliptical region with a size of approximately 2.0 mm as the major axis×1.5 mm as the minor axis.

Under the apparatus conditions mentioned above, measurement was performed using an out-of-plane arrangement in which the detection of incidence and diffraction of X-rays was performed in a plane perpendicular to the surface of the sample. Such measurement is referred to also as symmetrical reflection measurement because the angle of incidence and the angle of emission of X-rays with respect to the surface of the sample are equal. A point of difference from the tilt measurement described above is that the method used herein is a technique in which a light collecting optical system for micro-crystalline diffraction is used and the angle of diffraction ($2\theta$) and the sample axis ($\theta$) are linked together. Thus, the intensities of diffraction peaks of gallium nitride (0 0 0 2) appearing around $2\theta=34.6°$ were found by performing $2\theta/\theta$ scanning measurement in which scanning was performed in units of 0.02° steps through a range of $2\theta$ of 30.0° to 44.0°, with a counting time of 0.5 seconds.

Figure 8:
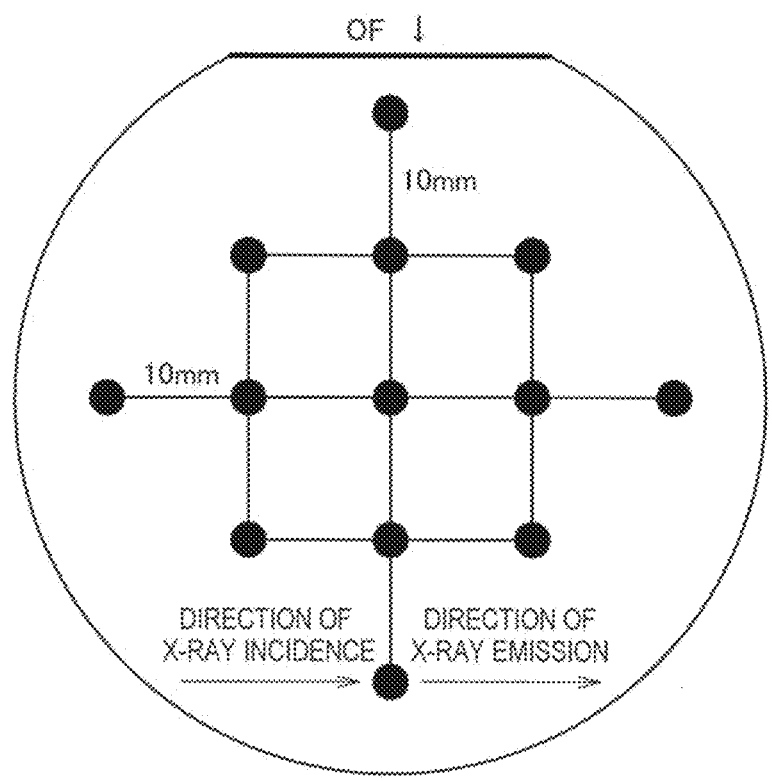
FIG. 8 is a schematic diagram showing an arrangement of a plurality of measurement points on a 2-inch sapphire substrate in which a crystal plane of (0 0 0 1) is a principal plane, in assessment of in-plane distribution.

The above measurement was performed on a plurality of points of a 2-inch sapphire substrate like that shown in FIG. 8 in which the crystal plane of (0 0 0 1) was a principal plane. The sapphire substrate was placed such that the directions of incidence and emission of X-rays are included in a direction parallel to an orientation flat surface (OF surface of (1 1 −2 0)).

Measurement points were set to the positions of the black circles shown in FIG. 8, and similar measurement was performed at intervals of 10 mm, on a total of 13 points, in a vertical-horizontal lattice configuration. The peak intensity of the (0 0 0 2) plane of gallium nitride was found at each measurement point, and the average value of the peak intensities of the (0 0 0 2) plane of gallium nitride at the 13 measurement points and the standard deviation were found. The average value of the peak intensities of the (0 0 0 2) plane of gallium nitride described above and the value of standard deviation/average value (an index indicating the in-plane intensity variation) are shown in Table 2 below, as results of the measurement of the in-plane intensity distribution for Example 1 and Comparative Example 2.

TABLE 2

| | Average value of peak intensities of GaN(0 0 0 2) [cps] | Standard deviation/average value of peak intensities of GaN(0 0 0 2) |
|---|---|---|
| Example 1 | $1 \times 10^5$ | 29% |
| Comparative Example 2 | $6 \times 10^2$ | 73% |

When the results of Table 2 are referred to, it can be seen that, in Example 1, the value of standard deviation/average value of the peak intensities of the (0 0 0 2) plane of gallium nitride is as low as 29%, and the variation in in-plane intensity is small. On the other hand, it can be seen that, in Comparative Example 2, the value of standard deviation/average value of the peak intensities of the (0 0 0 2) plane of gallium nitride is as high as 73%, and the variation in in-plane intensity is large.

(Assessment of Density of Threading Dislocations)

Next, in Example 1, the density of threading dislocations was assessed using an etch-pit method because a single crystal film of gallium nitride having a flat region with a sufficient thickness and a sufficient area was obtained. In Comparative Examples 1 to 3, the single crystal film of gallium nitride had a configuration of island-like shapes each having a size of approximately several micrometers to several tens of micrometers, and a flat region with a sufficient area was unable to be ensured; consequently, the density of threading dislocations was unable to be assessed.

Specifically, first, a sample approximately 10 mm square was cut out from the semiconductor substrate according to Example 1 after a single crystal film of gallium nitride was formed. Next, an etchant in which an 86 mass % potassium hydroxide solution and a 90 mass % sodium hydroxide solution were mixed together at 1:1 (molar ratio) was prepared and was put into a Zr-made crucible, and the whole of the Zr-made crucible containing the etchant was heated to 500° C. by a box-shaped oven.

Subsequently, the sample was wound with a 0.2-mm diameter Inconel wire, and was hung and immersed in the etchant heated to 500° C. for 1 minute. After that, the sample was taken out of the etchant, and was allowed to stand still at room temperature for 3 minutes. Next, the sample was immersed for 1 minute in dilute hydrochloric acid obtained by diluting 38 mass % hydrochloric acid with pure water at a mass ratio of 1:1, and then the sample was cleaned with pure water for 1 minute and was dried.

Figure 9:
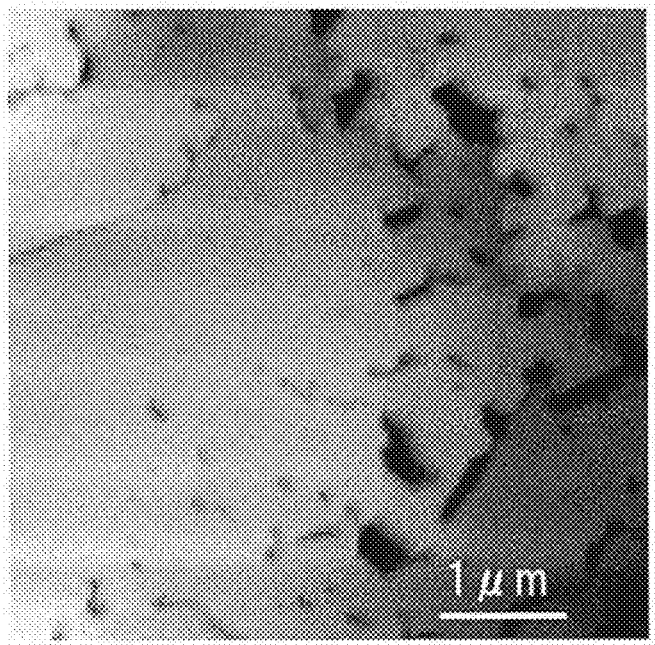
FIG. 9 is an AFM image in a 5 μm×5 μm observation area of a sample according to Example 1.

The surface of the gallium nitride single crystal of the sample after drying was observed with an AFM (Nano Scopella, manufactured by Digital Instruments, Inc.). The result is shown in FIG. 9. FIG. 9 is an AFM image in a 5 μm×5 μm observation area of the sample according to Example 1.

As shown in FIG. 9, the black shadow portion of the AFM image is a hole portion eroded by the hot alkali of the etchant, and corresponds to a place where there is a threading dislocation. The density of threading dislocations per unit area of the single crystal film of gallium nitride can be calculated by measuring the number of hole portions mentioned above in the observation field. In the sample according to Example 1, the density of threading dislocations has been able to be estimated as $3\times10^8/cm^2$. The density of threading dislocations at this level is at a quality level substantially equal to the quality level of a single crystal film of gallium nitride formed by common vapor phase growth.

(Assessment of Distribution of Crystal Orientation)

Subsequently, in Example 1, the distribution of crystal orientation was assessed using an electron back scattered diffraction (EBSD) method of a SEM. In Comparative Examples 1 to 3, the single crystal film of gallium nitride had a configuration of island-like shapes each having a size of approximately several micrometers to several tens of micrometers, and a flat region with a sufficient area was unable to be ensured; consequently, the distribution of crystal orientation was unable to be assessed.

Specifically, while a sample according to Example 1 was observed with a SEM (JSM-7100F, manufactured by JEOL Ltd.), analysis was performed by an electron back scattered diffraction (EBSD) method; thereby, a distribution of crystal orientation and information of crystal grains of the surface of the sample were obtained.

Figure 10:
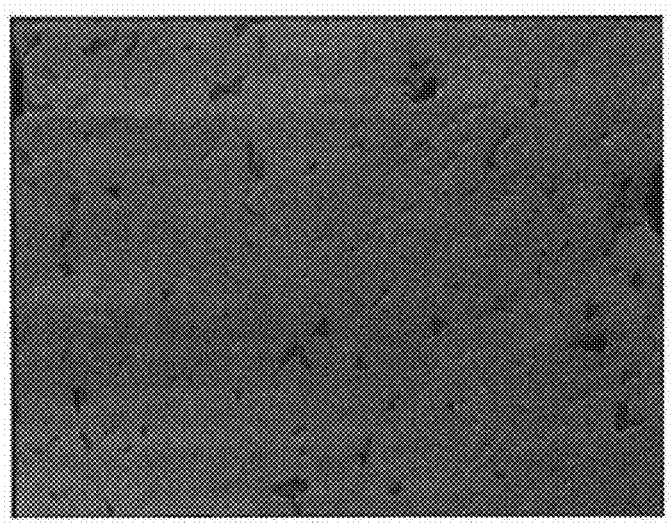
FIG. 10 is a SEM image of a sample according to Example 1.

FIG. 10 shows a SEM image of the sample according to Example 1. The observation was performed by setting the accelerating voltage at the time of SEM observation to 15 kV and the angle of inclination of the sample to 70°. The surface of the sample was not polished, and was observed in the surface state as it was after the formation of the gallium nitride single crystal; therefore, unevenness or recesses were observed on the surface of the sample.

Figure 11:
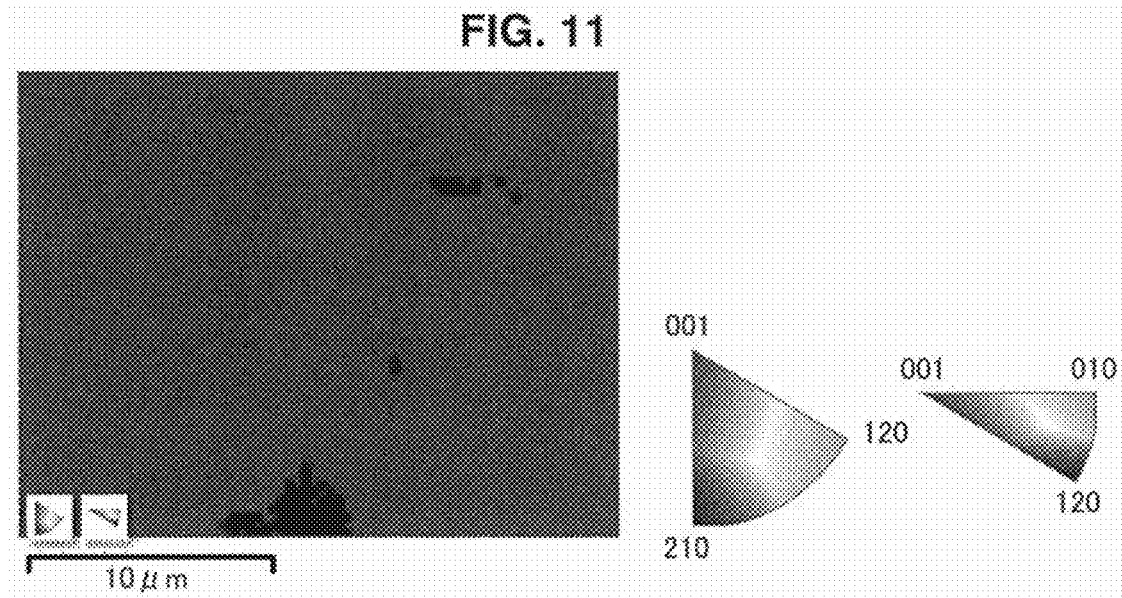
FIG. 11 is an inverse pole figure in which a result of analysis based on an EBSD method of the sample according to Example 1 is viewed from a Z-axis direction.

FIG. 11 shows an inverse pole figure map (IPF map) in which the result of analysis based on the EBSD method of the sample according to Example 1 is viewed from a Z-axis direction. In the IPF map, the direction of crystal orientation is shown by color-coding; in FIG. 11, it can be seen that almost the entire surface is the same color (001; the c-axis) and the crystal is oriented in the same orientation. Darker portions in FIG. 11 are shown in black color on a color image, and are places where a crystalline phase was unable to be identified. These places were in black color also in IPF maps viewed from other directions likewise, and therefore it is inferred that data were lost due to the influence of unevenness of the surface.

In the IPF map shown in FIG. 11, regions oriented in different crystal orientations, crystal grain boundaries, etc. were not observed in the sample according to Example 1. Therefore, also from a microscopic point of view, it has been found that the single crystal film of gallium nitride (the semiconductor layer) included in the semiconductor substrate according to Example 1 is a crystal thin film uniformly oriented in the c-axis direction.

(Assessment of Concentration Distribution of Iron Atoms)

Next, the concentration distribution of iron atoms of the gallium nitride crystal obtained by Example 1 was measured using secondary ion mass spectrometry (SIMS). Specifically, the concentration distribution of each kind of atoms in the thickness direction of the gallium nitride crystal obtained by Example 1 was measured using SIMS. For iron atoms (Fe), measurement was performed on three different places in the in-plane direction of the gallium nitride crystal.

Figure 12:
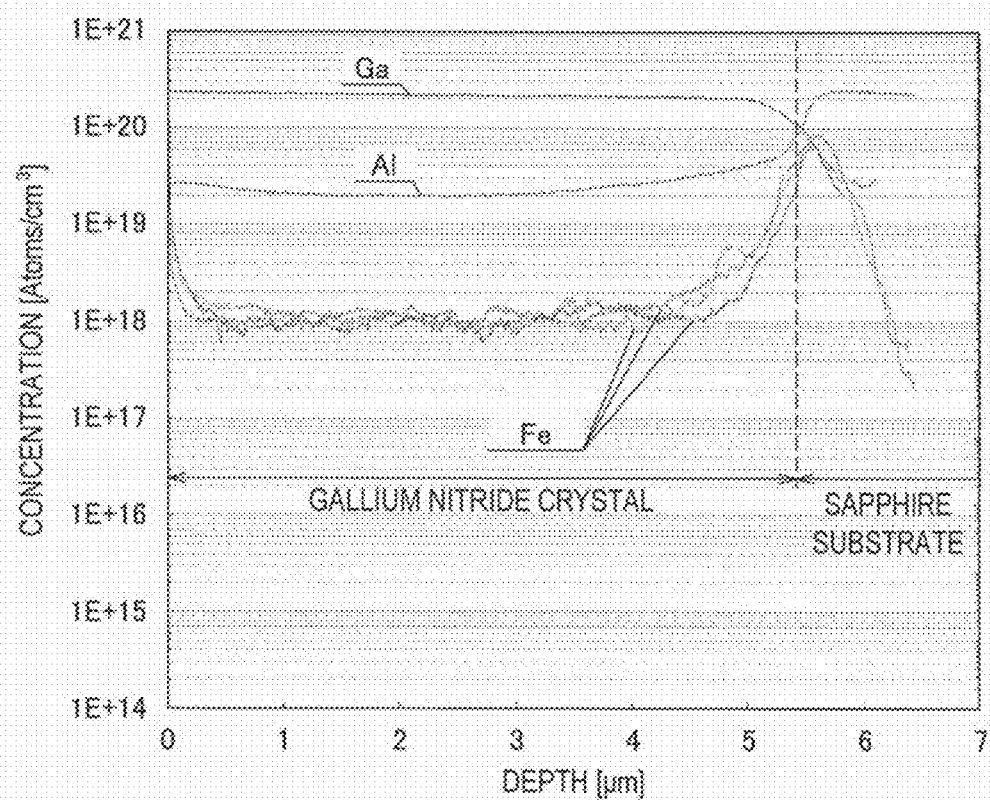
FIG. 12 is a graph showing a SIMS measurement result of a gallium nitride crystal obtained by Example 1.

The result of SIMS measurement of the gallium nitride crystal obtained by Example 1 is shown in FIG. 12. The horizontal axis of FIG. 12 represents the depth from the surface of the gallium nitride crystal. As shown in FIG. 12, it can be seen that, in the gallium nitride crystal obtained by Example 1, the concentration distribution of iron atoms is within the range of more than or equal to $1.0 \times 10^{16}$ atoms/cm$^3$ and less than or equal to $1.0 \times 10^{22}$ atoms/cm$^3$.

Further, it can be seen that, in the gallium nitride crystal obtained by Example 1, the concentration distribution of iron atoms has a bathtub shape in which the concentrations in the interface region with the sapphire substrate and the surface region of the gallium nitride crystal are higher than the concentration in the intermediate region between the interface region and the surface region. Specifically, it can be seen that the highest value of the concentration of iron atoms in the interface region with the sapphire substrate is more than or equal to 10 times the lowest value of the concentration of iron atoms in the intermediate region and that the highest value of the concentration of iron atoms in the surface region of the gallium nitride crystal is more than or equal to 10 times the lowest value of the concentration of iron atoms in the intermediate region.

Further, it can be seen that, in the gallium nitride crystal obtained by Example 1, the concentration of iron atoms in the intermediate region is substantially the same in the thickness direction of the gallium nitride crystal. Specifically, it can be seen that, in the thickness direction of the gallium nitride crystal, the difference between the concentrations of iron atoms at arbitrary two points in the intermediate region is less than or equal to 50% of the concentration of iron atoms at either one of the arbitrary two points. Therefore, it can be seen that a gallium nitride crystal in which iron atoms are doped uniformly in the intermediate region has been produced by Example 1.

Further, in the gallium nitride crystal obtained by Example 1, the concentration distributions of iron atoms measured in the three different places in the in-plane direction of the gallium nitride crystal are substantially the same. Specifically, it can be seen that, in the in-plane direction of the gallium nitride crystal, the difference between the concentrations of iron atoms at arbitrary two points in the intermediate region is less than or equal to 50% of the concentration of iron atoms at either one of the arbitrary two points. Therefore, it can be seen that a gallium nitride crystal in which the concentration of iron atoms is very uniform in the in-plane direction has been produced by Example 1.

Figure 13:
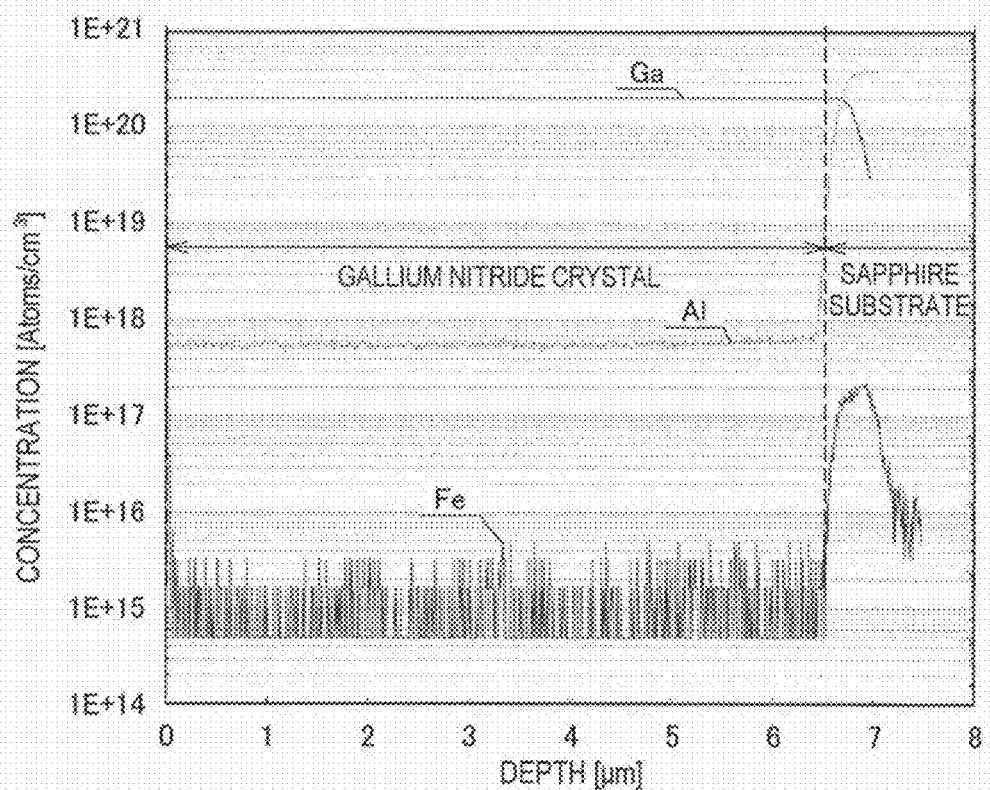
FIG. 13 is a graph showing a SIMS measurement result of a gallium nitride crystal that is formed on a sapphire substrate by vapor phase growth.

On the other hand, a result of SIMS measurement of a gallium nitride crystal that was formed on a sapphire substrate by vapor phase growth (a commercially available product produced by Ostendo Technologies, Inc.) is shown in FIG. 13. The horizontal axis of FIG. 13 represents the depth from the surface of the gallium nitride crystal.

As shown in FIG. 13, it can be seen that, in the gallium nitride crystal formed by vapor phase growth, the measurement value of the concentration of iron atoms indicates a neighborhood of $5 \times 10^{14}$ atoms/cm$^3$, which is the detection limit, and there are practically no iron atoms doped. Therefore, it can be seen that, in the case where iron atoms are doped into a gallium nitride crystal formed by vapor phase growth, the thermal diffusion method or the ion implantation method is used as described above, and hence crystal defects are caused to occur in the gallium nitride crystal after doped with iron atoms.

As described hereinabove, according to the present embodiment, a single crystal film that is more excellent in crystallinity, has a sufficient thickness, and also has a good in-plane distribution of crystallinity can be obtained for gallium nitride that is formed on a sapphire substrate by using a liquid phase method.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

What is claimed is:

1. A semiconductor substrate comprising:
a sapphire substrate;
an intermediate layer formed of gallium nitride with random crystal directions and provided on the sapphire substrate; and
at least one or more semiconductor layers each of which is formed of a gallium nitride single crystal and that are provided on the intermediate layer,
wherein a gallium nitride crystal layer that includes the intermediate layer and the semiconductor layer contains iron atoms,
a concentration distribution of iron atoms in the gallium nitride crystal layer, in a thickness direction of the gallium nitride crystal layer, is in a range of from more than or equal to $1.0\times10^{16}$ atoms/cm$^3$ to less than or equal to $1.0\times10^{22}$ atoms/cm$^3$, and
wherein the concentration distribution of iron atoms in the gallium nitride crystal layer, in a thickness direction of the gallium nitride crystal layer, is such that a concentration of iron atoms is higher in an interface region with the sapphire substrate and in a surface region of the gallium nitride crystal layer opposite the interface region with the sapphire substrate than the concentration of iron atoms in an intermediate region between the surface region and the interface region.

2. The semiconductor substrate according to claim 1, wherein a tilt width of gallium nitride that forms the intermediate layer and the semiconductor layer is more than or equal to 0.05° and less than or equal to 0.4°.

3. The semiconductor substrate according to claim 1, wherein a twist width of gallium nitride that forms the intermediate layer and the semiconductor layer is more than or equal to 0.1° and less than or equal to 0.7°.

4. The semiconductor substrate according to claim 1, wherein a plane orientation of a surface of the sapphire substrate on which the intermediate layer is provided is a c-plane or an a-plane.

5. The semiconductor substrate according to claim 1, wherein a highest value of a concentration of iron atoms in the interface region is more than or equal to 10 times a lowest value of a concentration of iron atoms in the intermediate region.

6. The semiconductor substrate according to claim 1, wherein, in the thickness direction of the gallium nitride crystal layer, a difference between concentrations of iron atoms at arbitrary two points in the intermediate region is less than or equal to 50% of the concentration of iron atoms at either one of the arbitrary two points.

7. The semiconductor substrate according to claim 1, wherein, in an in-plane direction of the gallium nitride crystal layer, a difference between concentrations of iron atoms at arbitrary two points in the intermediate region is less than or equal to 50% of the concentration of iron atoms at either one of the arbitrary two points.

8. The semiconductor substrate according to claim 1, wherein the interface region is a region within 2 μm in the thickness direction of the gallium nitride from an interface with the sapphire substrate, and
the surface region is a region within 1 μm in the thickness direction of the gallium nitride from a surface of the gallium nitride.

9. A method for producing a gallium nitride single crystal included in the semiconductor substrate according to claim 1, the method comprising:
a step of heating metal gallium and iron nitride in a nitrogen atmosphere to at least a reaction temperature at which the iron nitride and the metal gallium react together; and
a step of, after the metal gallium and the iron nitride are heated to the reaction temperature, holding the metal gallium and the iron nitride at a temperature within a range of the reaction temperature for more than or equal to 20 hours,
wherein the sapphire substrate is provided in the heated metal gallium and the heated iron nitride,
the iron nitride contains one or more of tetrairon mononitride, triiron mononitride, and diiron mononitride, and
the reaction temperature is more than 700° C. and less than or equal to 1000° C.

10. The semiconductor substrate according to claim 1, wherein the concentration of iron atoms at every depth of the intermediate region is lower than the concentration at the surface region and is lower than the concentration at the interface region.

11. The semiconductor substrate according to claim 1, wherein a highest value of a concentration of iron atoms in the surface region is more than or equal to 10 times a lowest value of a concentration of iron atoms in the intermediate region.

12. At least one or more layers of gallium nitride single crystals that are provided on a sapphire substrate via an intermediate layer formed of gallium nitride with random crystal directions,
wherein a gallium nitride crystal layer that includes the intermediate layer and a semiconductor layer contains iron atoms,
a concentration distribution of iron atoms in the gallium nitride crystal layer, in a thickness direction of the gallium nitride crystal layer, is in a range of from more than or equal to $1.0\times10^{16}$ atoms/cm$^3$ to less than or equal to $1.0\times10^{22}$ atoms/cm$^3$, and
wherein the concentration distribution of iron atoms in the gallium nitride crystal layer, in a thickness direction of the gallium nitride crystal layer, is such that a concentration of iron atoms is higher in an interface region with the sapphire substrate and in a surface region of the gallium nitride crystal layer opposite the interface region with the sapphire substrate than the concentration of iron atoms in an intermediate region between the surface region and the interface region.

13. The at least one or more layers of gallium nitride single crystals according to claim 12,
wherein each of tilt widths of the gallium nitride that forms the intermediate layer and the gallium nitride single crystal is more than or equal to 0.05° and less than or equal to 0.4°.

14. The at least one or more layers of gallium nitride single crystals according to claim 12,
wherein each of twist widths of the gallium nitride that forms the intermediate layer and the gallium nitride single crystal is more than or equal to 0.1° and less than or equal to 0.7°.

15. The at least one or more layers of gallium nitride single crystals according to claim 12,
wherein a plane orientation of a side of the sapphire substrate on which the intermediate layer is provided is a c-plane or an a-plane.

* * * * *